(12) United States Patent
Kuroda

(10) Patent No.: US 7,493,904 B2
(45) Date of Patent: Feb. 24, 2009

(54) LIQUID PROCESSING APPARATUS AND LIQUID PROCESSING METHOD

(75) Inventor: Osamu Kuroda, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/361,926

(22) Filed: Feb. 24, 2006

(65) Prior Publication Data

US 2006/0137721 A1  Jun. 29, 2006

Related U.S. Application Data

(62) Division of application No. 09/873,478, filed on Jun. 4, 2001, now Pat. No. 7,108,752.

(30) Foreign Application Priority Data

Jun. 5, 2000  (JP) .............................. 2000-167900

(51) Int. Cl.
*B08B 5/00* (2006.01)
(52) U.S. Cl. ..................... 134/22.19; 134/22; 134/1.2; 134/1.3; 134/26; 134/133; 216/28; 438/689
(58) Field of Classification Search ................. 438/689; 134/26, 22; 216/28
See application file for complete search history.

(56) References Cited

U.S. PATENT DOCUMENTS

| 6,009,890 A | * | 1/2000 | Kaneko et al. .............. 134/133 |
| 6,051,349 A | | 4/2000 | Yoshioka et al. |
| 6,203,627 B1 | * | 3/2001 | Shindo et al. ................. 134/18 |

* cited by examiner

*Primary Examiner*—Nadine Norton
*Assistant Examiner*—Maki Angadi
(74) *Attorney, Agent, or Firm*—Morrison & Foerster LLP

(57) ABSTRACT

A liquid processing apparatus comprises a liquid processing section for applying a liquid processing to wafers W, a carrier delivery section for delivering the carrier housing the wafers W, a carrier stock section capable of storing a plurality of carriers, an interface section for transferring the wafers W between the carrier stock section and the liquid processing section, a carrier transfer device for transferring the carrier, a wafer inspecting device for inspecting the wafers W within the carrier, and a carrier transfer device control section for controlling the carrier transfer device. The carrier transfer device control section controls the carrier transfer device such that the carrier, which has been judged to be capable of a liquid processing on the basis of the result of the inspection of the wafers W, is stored in the carrier stock section, and the liquid processing is started after completion of the inspection of a predetermined number of carriers.

14 Claims, 10 Drawing Sheets

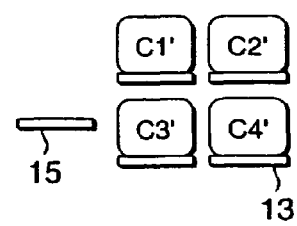
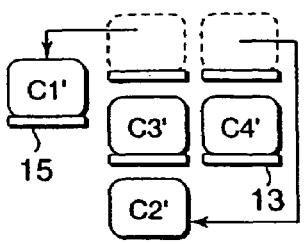
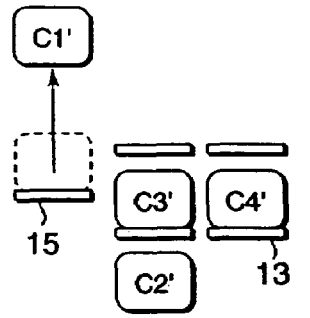
FIG.10A  FIG.10B  FIG.10C
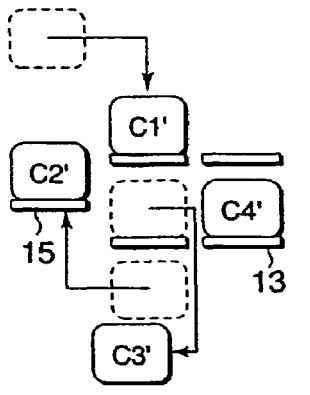
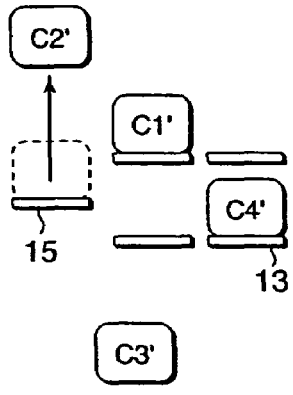
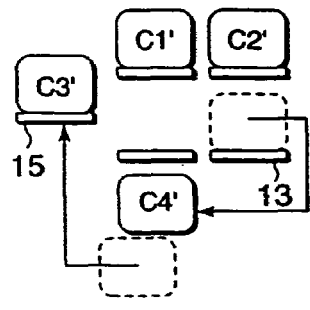
FIG.10D  FIG.10E  FIG.10F
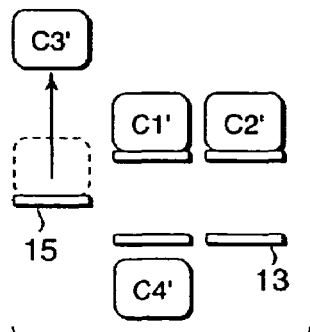
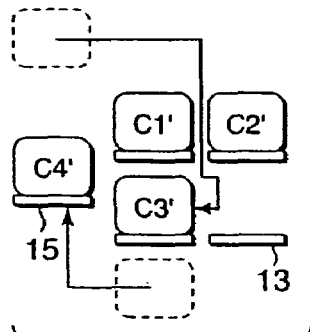
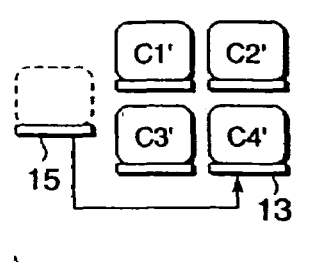
FIG.10G  FIG.10H  FIG.10I

LIQUID PROCESSING APPARATUS AND LIQUID PROCESSING METHOD

CROSS REFERENCE TO RELATED APPLICATION

This application is a division of application Ser. No. 09/873,478 filed on Jun. 4, 2001, the entire contents of which are incorporated herein by reference.

BACKGROUND OF THE INVENTION

1. Field of the Invention

The present invention relates to a liquid processing apparatus and a liquid processing method for applying a predetermined liquid processing to a substrate such as a semiconductor wafer.

2. Description of the Related Art

In the manufacturing process of a semiconductor device, a liquid processing apparatus is used for processing a semiconductor wafer (wafer) with a process solution such as a chemical solution or pure water so as to remove contaminants such as particles, organic contaminants and metal impurities from the wafer and for applying an etching treatment to the wafer.

With a prominent progress achieved in recent years in the miniaturization, degree of integration and mass production of semiconductor devices, the wafer size is increased from 200 mm ø (8 inches) to 300 mm ø (12 inches). As a result, the weight of the wafer itself is increased, and the carrier (container) housing the wafers is rendered bulky and heavy. For storing and transferring wafers of 300 mm ø, used is a carrier horizontally housing, for example, 25 wafers a predetermined distance apart from each other. On the other hand, concerning the liquid processing of the wafer, it is desirable in terms of the productivity to process simultaneously as large number of wafers as possible. Such being the situation, employed is a method of processing, for example, 50 wafers in a single operation.

For subjecting 50 wafers of 300 mm ø to a liquid processing, it is necessary to transfer the wafers housed in two carriers into a liquid processing apparatus. For example, 25 wafers housed substantially horizontal in a single carrier are taken out by using a wafer delivery device so as to be delivered to a posture changing device within the liquid processing apparatus. Then, additional 25 wafers housed in another carrier are delivered to the posture changing device by using the wafer delivery device. In the posture changing device, a total of 50 wafers are collectively changed from the horizontal posture into the vertical posture, and the 50 wafers that are held vertical are delivered to the wafer transfer device so as to be transferred into a liquid processing section. A predetermined liquid processing or a drying processing is applied to the wafers in the liquid processing section. After the liquid processing, the wafers are brought back to the two vacant carriers such that 25 wafers are housed in each of these vacant carriers by the procedures opposite to those in the process of transferring the wafers into the liquid processing sections.

However, a difficulty is brought about in the case where the wafers housed in two carriers are subjected to a liquid processing as a single lot. Specifically, where the predetermined number of wafers are not housed in the second carrier, though the wafers housed in the first carrier are transferred into the posture changing device without any problem, it is necessary for the wafers transferred previously into the posture changing device not to be subjected to the liquid processing and to be returned again from the posture changing device to the carrier for starting the processing for another lot, giving rise to the problem in respect of the loss of the liquid processing time.

It should also be noted that, where the wafers are transferred into and out of the carrier through a single position, it is necessary to move the vacant carrier, from which the wafers have been taken out, to a predetermined site and, then, to transfer another carrier housing the wafers to the wafer transfer site. Since a predetermined time is required for the carrier transfer, another problem is generated that the through-put is lowered.

What should also be noted is that, where the wafers are taken out of the carrier, in which the wafers are housed substantially horizontal, by using a wafer delivery device so as to be delivered to the posture changing device and, then, the wafers are delivered to a wafer transfer device for transferring into the liquid processing section or where the wafers are transferred in the opposite route, the number of required mechanisms is increased so as to increase the arranging area and, thus, to the problem of an enlarge footprint of the apparatus.

BRIEF SUMMARY OF THE INVENTION

A first object of the present invention is to provide a liquid processing apparatus and a liquid processing method, in which the liquid processing is applied for each lot while preventing the returning operation of the unprocessed wafer so as to improve the productivity. A second object of the present invention is to provide a liquid processing apparatus that permits improving the through-put by efficiently transferring the carrier. Further, a third object of the present invention is to provide a liquid processing apparatus that permits diminishing the footprint.

According to a first aspect of the present invention, there is provided a liquid processing apparatus comprising a liquid processing section for applying a predetermined liquid processing to a substrate; a carrier delivery section for delivering a carrier having a plurality of substrates housed therein; a carrier stock section capable of storing a plurality of carriers; a substrate transfer section for transferring the substrate into said liquid processing section; a carrier transfer device for transferring the carrier within said carrier stock section; a substrate inspecting device for inspecting the number and/or the housed state of substrates within the carrier; and a carrier transfer device control section for controlling said carrier transfer device such that the carrier is stored in said carrier stock section in the case where it is judged possible to apply a liquid processing to the substrate on the basis of the result of the inspection performed by said substrate inspecting device.

According to a second aspect of the present invention, there is provided a liquid processing apparatus comprising a liquid processing section for applying a predetermined liquid processing to a substrate; a carrier delivery section for delivering a carrier having a plurality of substrates housed therein substantially horizontal a predetermined distance apart from each other; a carrier stock section capable of storing a plurality of carriers; a substrate transfer section for transferring the substrate into said liquid processing section; a carrier transfer device for transferring the carrier within said carrier stock section; a substrate inspecting device for inspecting the number and/or the housed state of substrates within the carrier; and a carrier transfer device control section for controlling said carrier transfer device such that the carrier is stored in said carrier stock section in the case where it is judged possible to apply a liquid processing to the substrate on the basis of the result of the inspection performed by said substrate inspecting device;

wherein said substrate transfer section includes a substrate delivery device for delivering substrates into and out of the carrier; a substrate transfer device for delivering substrates into and out of said liquid processing section; and a substrate transplanting device for delivering the substrates in a substantially horizontal state into and out of said substrate delivery device and for delivering the substrates in substantially a vertical state into and out of said substrate transfer device.

According to a third aspect of the present invention, there is provided a liquid processing apparatus comprising a liquid processing section for applying a predetermined liquid processing to a substrate; a carrier delivery section for delivering a carrier having a plurality of substrates housed therein substantially horizontal a predetermined distance apart from each other; a carrier stock section capable of storing a plurality of carriers; a substrate transfer section for transferring the substrate into said liquid processing section; a carrier transfer device for transferring the carrier within said carrier stock section; a substrate inspecting device for inspecting the number and/or the housed state of substrates within the carrier; and a carrier transfer device control section for controlling said carrier transfer device such that the carrier is stored in said carrier stock section in the case where it is judged possible to apply a liquid processing to the substrate on the basis of the result of the inspection performed by said substrate inspecting device;

wherein said substrate transfer section includes a substrate transfer device for delivering substrates into and out of said liquid processing section; and a substrate delivery/posture changing device for delivering the substrate into and out of the carrier and for changing the posture of the held substrate between a substantially horizontal state and a substantially vertical state for delivery of the substrate into and out of said substrate transfer device.

According to a fourth aspect of the present invention, there is provided a liquid processing apparatus comprising a liquid processing section for applying a predetermined liquid processing to a substrate; a carrier delivery section for delivering a carrier having a plurality of substrates housed therein; a carrier stock section capable of storing a plurality of carriers; a carrier transfer device for transferring the carrier within said carrier stock section; a substrate inspecting device for inspecting the number and/or housed state of the substrates in the carrier; a carrier retreat device for transferring the carrier between the inspecting position where the inspection is performed by said substrate inspection device and a predetermined retreat position; a carrier transfer device control section for controlling said carrier transfer device such that the carrier is stored in said carrier stock section in the case where it is judged possible to apply a liquid processing to the substrate on the basis of the result of the inspection performed by said substrate inspecting device; and a substrate transfer section for transferring the substrate into said liquid processing section.

According to a fifth aspect of the present invention, there is provided a liquid processing method for applying a predetermined liquid processing to the substrates housed in a first carrier and a second carrier, comprising a first step for inspecting the number and/or housed state of the substrates within the first carrier; a second step for storing the first carrier within the carrier stock section in the case where it is judged by the inspection in said first step that it is possible to apply a liquid processing, and for stopping the liquid processing applied to the substrates stored in the first and second carriers in the case where it is judged by the inspection in said first step that the liquid processing should be stopped; a third step for inspecting the number and/or housed state of the substrates within the second carrier in the case where the first carrier is stored in the carrier stock section; and a fourth step for transferring the substrates within the second carrier to the liquid processing section in the case where it is judged by the inspection in said third step that the liquid processing can be applied, followed by transferring the substrates within the first carrier into the liquid processing section, or, where it is judged by the inspection in said third step that the liquid processing should be stopped, for stopping the liquid processing of the substrates within the second carrier.

According to a sixth aspect of the present invention, there is provided a liquid processing method for applying a liquid processing to predetermined substrates, comprising a first step for inspecting the number and/or housed state of the substrates within a carrier; a second step for storing in a carrier stock section the carrier which has been judged to be capable of the liquid processing in the inspection in said first step and stopping the liquid processing in respect of the carrier for which it has been judged in the inspection in said first step that the liquid processing should be stopped; a third step for carrying out said first step and said second step for a predetermined number of carriers; a fourth step for transferring another carrier from the carrier stock section in the case where the another carrier, which is to be processed in a pair with the carrier for which it has been judged in the inspection in said first step that the liquid processing should be stopped, is already stored in the carrier stock section; and a fifth step for starting the liquid processing that is applied to the substrates in the carrier after the number of carriers stored in the carrier stock section has reached the predetermined number.

Further, according to a seventh aspect of the present invention, there is provided a liquid processing apparatus comprising a liquid processing section for applying a predetermined liquid processing to a substrate; a carrier delivery section for delivering a carrier having a plurality of substrates housed therein substantially horizontal a predetermined distance apart from each other; a carrier stock section capable of storing a plurality of carriers; a substrate transfer section for transferring the substrate into said liquid processing section; and a carrier transfer device for transferring the carrier within said carrier stock section;

wherein said substrate transfer section includes a substrate transfer device for delivering the substrate into and out of said liquid processing section; and a substrate delivery/posture changing device for delivering the substrates into and out of the carrier and for changing the posture of the held substrate between a substantially horizontal state and a substantially vertical state thereby transferring the substrate into and out of said substrate transfer device.

In the liquid processing apparatus and the liquid processing method according to the first to sixth aspects of the present invention described above, the liquid processing can be started after confirmation of the number and/or housed state of substrates within a plurality of carriers constituting a certain lot. As a result, it is possible to eliminate the situation that, after the substrates are taken out of the first carrier and transferred to the liquid processing section, it is found that the processing cannot be performed because of, for example, the shortage of the substrates within the carrier. It follows that it is possible to eliminate the time loss required for the returning of the substrate from the liquid processing section back into the carrier, thereby improving the through-put.

It should also be noted that a carrier retreat device is arranged in the carrier stock section. Therefore, it is possible for the carrier transfer device to transfer the carrier that is to be subjected to the next inspection to a region in the vicinity of the inspecting position during inspection of the state of the substrates within a certain carrier. Soon after the inspected carrier is moved to a retreat position by the carrier retreat device, the carrier held by the carrier transfer device can be disposed on the inspecting position so as to start inspection of the state of the substrate. On the other hand, it is possible for the carrier transfer device to transfer the carrier held by the carrier retreat device back to the original storing position during inspection of the substrate, thereby improving the through-put.

Further, in the liquid processing apparatus according to the seventh aspect of the present invention, the mechanism for delivering the substrate into and out of the carrier and the mechanism for changing the posture of the held substrate between a substantially horizontal state and a substantially vertical state are made integral so as to provide a compact system, making it possible to decrease the footprint of the liquid processing apparatus. Also, since the number of times of delivery of the substrates is decreased, it is possible to obtain an additional effect of preventing a damage done to the substrate and to the apparatus.

BRIEF DESCRIPTION OF THE SEVERAL VIEWS OF THE DRAWING

FIGS. 10A to 10I collectively show how the carriers are transferred in the carrier stock section included in the liquid processing apparatus shown in FIG. 6.

DETAILED DESCRIPTION OF THE INVENTION

Some embodiments of the present invention will now be described in detail with reference to the accompanying drawings. In the embodiments described below, the technical idea of the present invention is applied to a liquid processing apparatus in which the transfer, liquid processing, and drying of semiconductor wafers are consistently carried out in a batch system.

Figure 1:
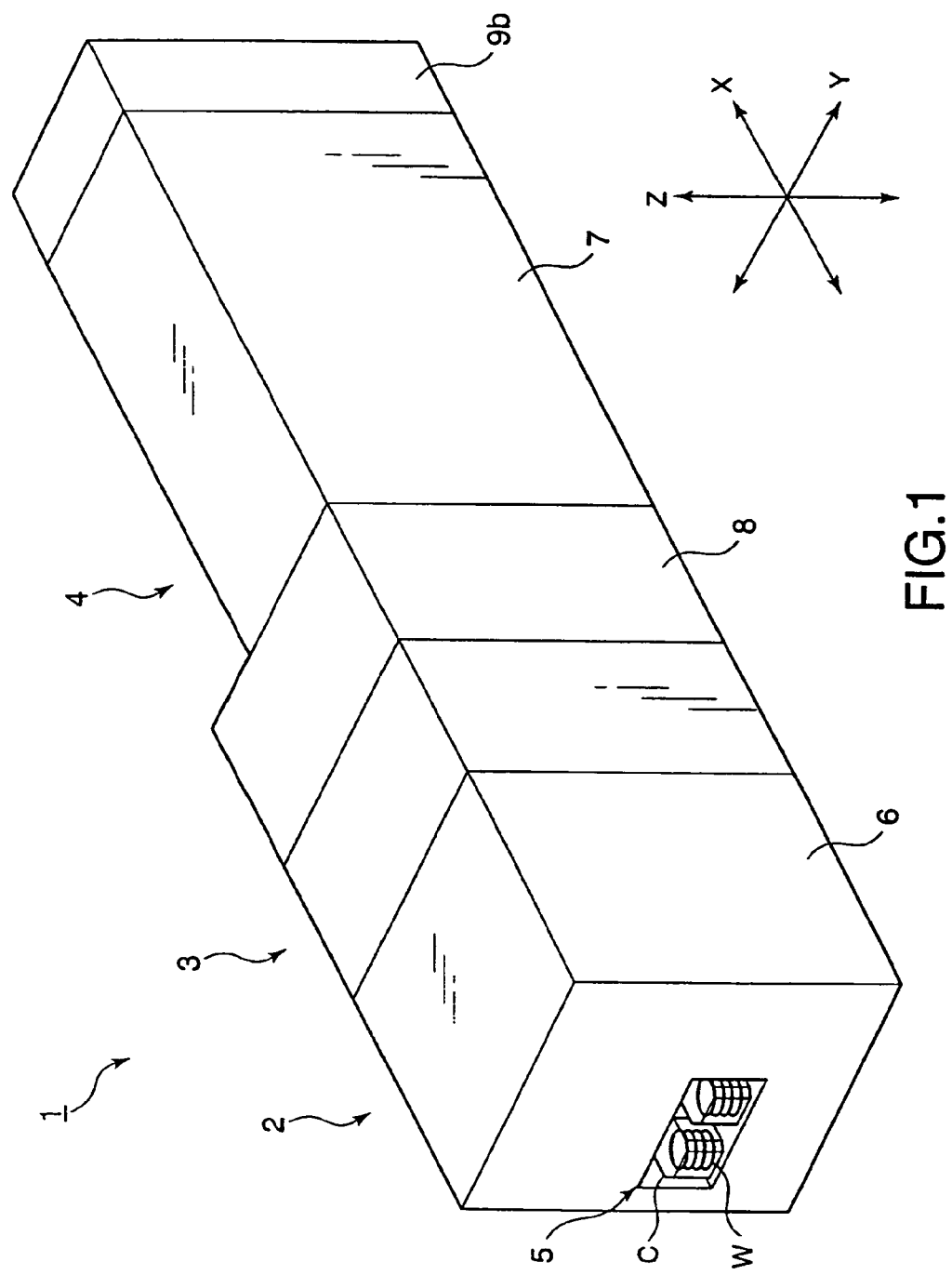
FIG. 1 is an oblique view showing a liquid processing apparatus according to one embodiment of the present invention.
Figure 2:
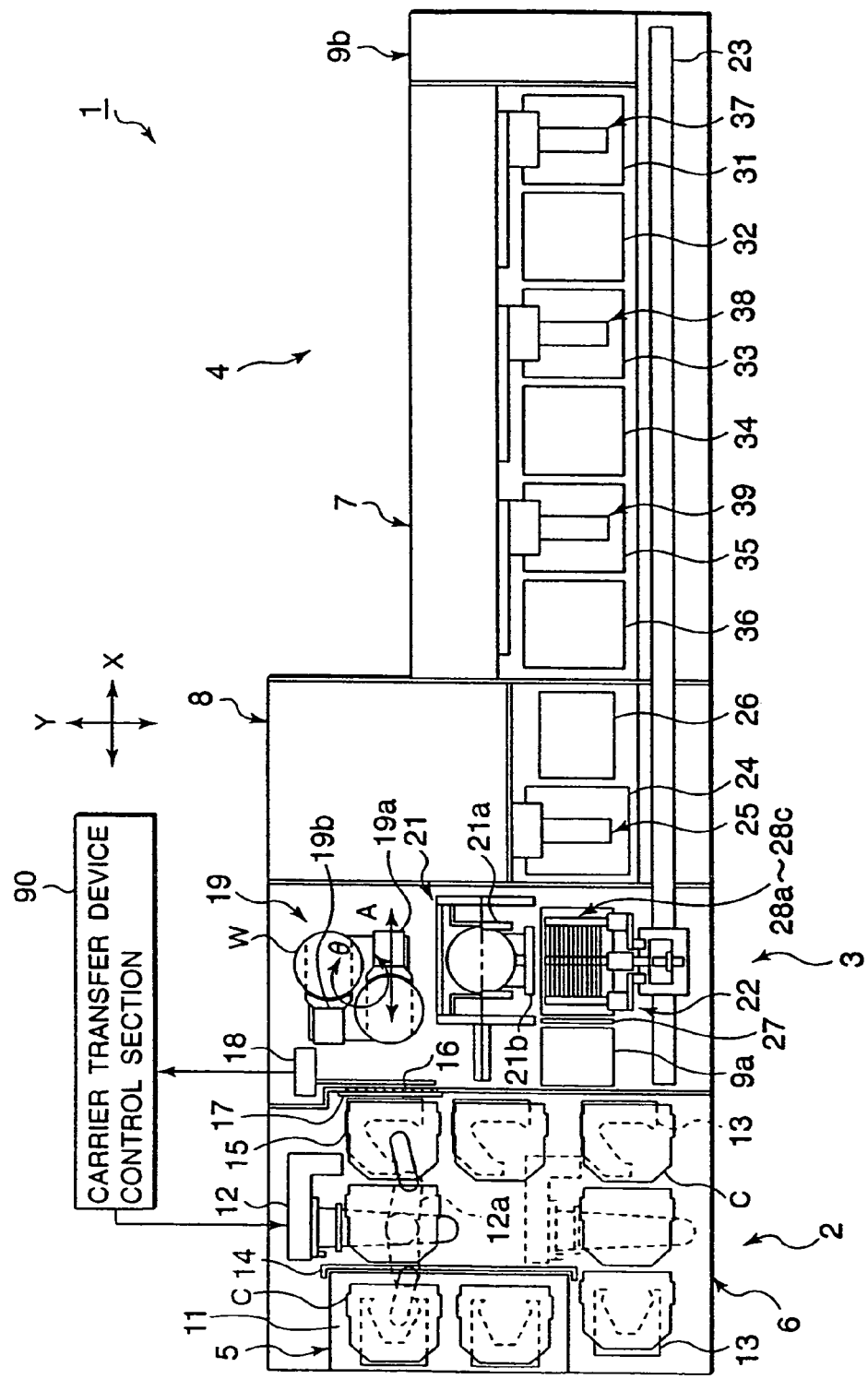
FIG. 2 is a plan view schematically showing the construction of the liquid processing apparatus shown in FIG. 1.

FIG. 1 is an oblique view showing the construction of a liquid processing apparatus 1 according to one embodiment of the present invention, and FIG. 2 is a plan view of the liquid processing apparatus. As shown in FIGS. 1 and 2, the liquid processing apparatus 1 comprises mainly a delivery section 2 for transferring a carrier C having wafers W housed therein in a horizontal state or for storing the carrier C, a liquid processing section 4 for applying a liquid processing by using a predetermined chemical solution to the wafer W or for applying a drying processing to the wafer W, and an interface section 3 for transferring the wafer W between the delivery section 2 and the liquid processing section 4.

The delivery section 2 comprises a carrier delivery section 5 and a carrier stock section 6. A stage 11 for supporting the carrier C is arranged in the carrier delivery section 5. The carrier C is constructed such that a plurality of wafers W, e.g., 25 wafers, can be housed in a substantially horizontal state a predetermined distance apart from each other in the carrier C. The transfer port of the wafer W, which can be opened or closed by a lid, is formed in one side surface of the carrier C. On the other hand, a plurality of carrier holding members 13 each capable of holding the carrier C are arranged in the carrier stock section 6 for storing the plural carriers C. The carrier C supported by the stage 11 and housing the wafers W before the liquid processing is transferred by a carrier transfer device 12 into the carrier stock section 6. On the other hand, the carrier C housing the wafers W after the liquid processing is transferred by the carrier transfer device 12 from the carrier stock section 6 onto the stage 11.

A shutter 14 is arranged between the carrier delivery section 5 and the carrier stock section 6. The shutter 14 is kept closed in order to separate the atmosphere between the carrier delivery section 5 and the carrier stock section 6, though the shutter 14 is opened only when the carrier C is transferred between the carrier delivery section 5 and the carrier stock section 6.

The carrier transfer device 12 includes an arm 12a such as a multi-joint arm or a shrinkable arm, which is driven to permit at least the carrier C to be moved in an X-direction. The carrier C is held by the arm 12a so as to be transferred. The carrier transfer device 12 can also be driven in a Y-direction and a Z-direction (height direction) by a Y-axis driving mechanism and a Z-axis driving mechanism so as to permit the carrier C to be disposed on a carrier holding member 13 arranged in a predetermined position.

In FIG. 2, the carrier holding members 13 are arranged in four points in the vicinity of the wall forming the carrier stock section 6 including an upper portion of an inspection/delivery stage 15 described herein later. The carrier holding member 13 in each point has a plurality of stages, e.g., four stages, in the height direction. The carrier stock section 6 temporarily stores the carrier C housing the wafer W before the liquid processing and the vacant carrier C from which the wafer W was taken out.

A window portion 16 is formed at the boundary between the carrier stock section 6 and the interface section 3. An inspection/delivery stage 15 having the construction similar to that of the carrier holding member 13 is arranged on the side of the carrier stock section 6 of the window portion 16. The carrier C is disposed on the stage 15 such that the lid of the carrier C faces the window portion 16. Incidentally, it is possible to allow the carrier transfer device 12 to hold the carrier C for a predetermined time in a predetermined space facing the window portion 16 in place of arranging the inspection/delivery stage 15.

A lid opening/closing mechanism 17 for opening/closing the lid of the carrier C disposed on the inspection/delivery stage 15 is arranged on the side of the carrier stock section 6 of the window portion 16. The wafer W within the carrier C can be transferred toward the interface section 3 by keeping open the window portion 16 and the lid of the carrier C. By contraries, the wafer W can be transferred from the side of the interface section 3 into the vacant carrier C. Incidentally, it is possible to arrange the lid opening/closing mechanism 17 on the side of the interface section 3 of the window portion 16.

A wafer inspecting device 18 for counting the number of wafers W within the carrier C is arranged on the side of the interface section 3 of the window portion 16. The wafer inspecting device 18, which comprises an infrared ray sensor head having a signal transmitting section and a signal receiving section, is scanned in the Z-direction in the vicinity of the edge in the X-direction of the wafer W housed in the carrier C so as to detect the signal of the transmitted light or reflected light of the infrared ray between the signal transmitting section and the signal receiving section, thereby detecting the number of wafers W. In addition to the function of detecting the number of wafers W, it is desirable for the wafer inspecting device 18 to perform the function of inspecting the housed state of the wafers W. For example, it is desirable for the wafer inspecting device 18 to perform the function of inspecting whether the wafers W are correctly arranged in parallel at a predetermined pitch within the carrier C, and whether the wafers W are not housed obliquely at different stages of the carrier C. Also, it is possible to construct the wafer inspecting device 18 such that the number of wafers W is detected after confirmation of the housed state of the wafers W.

Incidentally, the wafer inspecting device for inspecting only the number of wafers W is used in the case where, for example, it is known by experiences that the stage deviation of the wafer W within the carrier C scarcely takes place. On the other hand, the wafer inspecting device for inspecting only the housed state of the wafers W is used in the case where, for example, it is known by experiences that an error in the number of wafers W housed in the carrier C scarcely takes place.

The operations of the carrier transfer device 12 and the wafer inspecting device 18 are controlled by a carrier transfer device control section 90. For example, the carrier transfer device control section 90 controls the carrier transfer device 12 such that, after the number of wafers W within the carrier C is inspected by the wafer inspecting device 18, the carrier C is stored in the carrier stock section 6. The carrier transfer device control section 90 is interlocked with the carrier transfer device 12 so as to control the opening/closing of the shutter 14, the opening/closing of the window 16, and the operation of the lid opening/closing mechanism 17.

A wafer delivery device 19, a wafer transplanting device 21 and a wafer transfer device 22 are arranged in the interface section 3. The wafer transplanting device 21 comprises a posture changing mechanism 21a performing the wafer delivery with the wafer delivery device 19 and changing the posture of the wafer W, and a wafer vertical holding mechanism 21b performing the wafer delivery between the posture changing mechanism 21a and the wafer transfer device 22.

The wafer delivery device 19 takes out the wafer W within the carrier C through the window portion 16 and delivers the wafer W to the posture changing mechanism 21a. Also, the device 19 receives the wafer W after the liquid processing from the posture changing mechanism 21a and transfers the wafer W into the carrier C. The wafer delivery device 19 has two systems of arms, i.e., an arm 19a for transferring the unprocessed wafer W and another arm 19b for transferring the wafer W after the liquid processing. These arms 19a and 19b are arranged a predetermined distance apart from each other in the Z-direction in conformity with the arranging pitch and the number of wafers W within the carrier C such that the plural wafers W housed in the carrier C can be collectively held by these arms 19a, 19b. In the state shown in FIG. 2, the arms 19a, 19b are slidable or shrinkable in the direction denoted by an arrow A and is movable in the Z-direction by a predetermined distance. Further, the entire wafer delivery device 19 is swingable in a θ-direction, with the result that it is possible for the arms 19a and 19b to gain access to any of the carrier C disposed on the inspection/delivery stage 15 and the posture changing mechanism 21a.

The wafer delivery device 19 is driven as follows. In the first step, under the state that the arm 19a is on the side of the wafer transplanting device 21 and the direction of the arrow A coincides with the X-direction, the arm 19a is slid or elongated so as to be inserted below the wafer W. Then, the arm 19a is moved upward by a predetermined distance so as to permit the wafer W to be held by the arm 19a, followed by sliding the arm 19a in the opposite direction or by shrinking the arm 19a so as to take the wafer W out of the carrier C. Then, the entire wafer delivery device 19 is swung by 90° in the counterclockwise direction in FIG. 2 so as to permit the direction of arrow A to coincide with the Y-direction and to allow the arm 19a to be positioned on the side of the liquid processing section 4. Under this condition, the arm 19a is slid or elongated so as to deliver the wafer W held on the arm 19a to the posture changing mechanism 21a.

On the other hand, under the state that the direction of the arrow A coincides with the Y-direction and the arm 19b is positioned on the side of the liquid processing section 4, the arm 19b is slid or elongated so as to take out the wafer W after the liquid processing from the posture changing mechanism 21a, followed by swinging the entire wafer delivery device 19 by 90° in the clockwise direction in FIG. 2 so as to permit the direction of the arrow A to coincide with the X-direction and to permit the arm 19b to be positioned on the side of the wafer transplanting device 21. Under this condition, the arm 19b is slid or elongated so as to transfer the wafer W held by the arm 19b into the vacant carrier C.

The wafer W is held substantially horizontal when the wafer W is transferred by the wafer delivery device 19. However, since it is necessary to keep the wafer W substantially vertical when the wafer W is washed, the posture of the wafer W is changed in the posture changing device 21a. The posture changing device 21a includes, for example, a guide member having grooves or the like formed for holding the wafers W in conformity with the arranging pitch of the wafers W within the wafer delivery device 19. The posture of the plural wafers W is changed from the horizontal state into the vertical state by swinging the guide member or the like holding the plural wafers W by about 90° in a predetermined direction. The wafers W held vertical in this fashion are once delivered onto the wafer vertical holding mechanism 21b before the wafers W are delivered to the wafer transfer device 22.

The wafer vertical holding mechanism 21b includes a groove portion capable of housing the wafers W at an arranging pitch half the wafer arranging pitch within the carrier C (see FIGS. 8A and 8B referred to herein later), with the result that a total of 50 wafers housed in two carriers C can be housed in the wafer vertical holding mechanism 21b. It follows that the wafers W housed in two carriers C can be subjected to the liquid processing simultaneously. The wafer vertical holding mechanism 21b is slidable between the position where delivery of the wafers W can be performed with the posture changing mechanism 21a and the position where delivery of the wafers W can be performed with chucks 28a to 28c of the wafer transfer device 22, and is constructed such that, when the wafer vertical holding mechanism 21b is slid toward the wafer transfer device 22 while holding the wafers W, which are held substantially vertical, on the lower side of the wafers W, the mechanism 21b does not collide against the chucks 28a to 28c of the wafer transfer device 22.

The arranging pitch of the wafers W within the wafer transplanting device 21 is adjusted, for example, as follows. In the first step, 25 wafers are transplanted from the first carrier C into the posture changing mechanism 21a by the wafer delivery device 19. Then, the posture of the wafers W is changed from a substantially horizontal state into a substantially vertical state in the posture changing mechanism 21a and, then, the wafers W are delivered into the wafer vertical holding mechanism 21b. In this step, the arranging pitch of the wafers W delivered to the wafer vertical holding mechanism 21b is equal to the arranging pitch within the carrier C. Then, 25 wafers are transplanted from the second carrier C into the posture changing mechanism 21a by the wafer delivery device 19. The posture of the wafers W is changed from the horizontal state into the vertical state in the posture changing mechanism 21a and, then, the wafers W are delivered into the wafer vertical holding mechanism 21b. In this step, the position of the wafer vertical holding mechanism 21b is deviated by a distance equal to half the arranging pitch in the arranging direction of the wafers W, thereby allowing the wafer vertical holding mechanism 21b to hold the wafers W at an arranging pitch half the arranging pitch within the carrier C.

The method of halving the arranging pitch of the wafers W is not limited to the method described above. For example, the posture changing mechanism 21a is constructed to be capable of holding 50 wafers, which can be housed in two carriers C, at an arranging pitch half the arranging pitch within the carrier C. When the wafers W within the second carrier C are transplanted from the wafer delivery device 19 into the posture changing mechanism 21a, the height of any one of the wafer delivery device 19 and the posture changing mechanism 21a is deviated as a whole by half the arranging pitch of the wafers W within the carrier C. In this fashion, the posture of the 50 wafers held by the posture changing mechanism 21a is collectively changed so as to deliver the 50 wafers W into the wafer vertical holding mechanism 21b.

Also, for example, after the wafers W housed in a single carrier C are delivered into the posture changing mechanism 21a in the arranging pitch equal to the arranging pitch of the wafers W within the carrier C, it is possible to change the arranging pitch of the wafers W at the timing of any of before and after the posture of the wafers W is changed from the horizontal state into the vertical state in the posture changing mechanism 21a. It is also possible to mount a mechanism of adjusting the arranging pitch to the wafer vertical holding mechanism 21b.

Further, it is possible to construct the posture changing mechanism 21a to permit the wafer W to be swung by 90° in each of the forward direction and the reverse direction. In this case, the posture of the wafers W in the first carrier C is changed by the swinging in the forward direction within the posture changing mechanism 21a and, then, these wafers W are delivered to the wafer vertical holding mechanism 21b. On the other hand, the posture of the wafers W in the second carrier C is changed by the swinging in the reverse direction in the posture changing mechanism 21a and, then, these wafers W are delivered to the wafer vertical holding mechanism 21b. As a result, the processing surfaces of the wafers W on which resist films or the like are formed in the subsequent step are allowed to face each other in the wafer vertical holding mechanism 21b. It should be noted that, if the posture of the wafers W in the second carrier C is changed by the swinging in the forward direction and, then, these wafers W are delivered to the wafer vertical holding mechanism 21b, all the wafers delivered from the first and second carriers C into the wafer vertical holding mechanism 21b are arranged such that the processing surfaces of the wafers W are allowed to face in the same direction.

The wafers W that are held vertical are transferred between the wafer transfer device 22 and the wafer vertical holding mechanism 21b. To be more specific, the wafer transfer device 22 transfers the unprocessed wafer W into the liquid processing section 4 and takes the wafers after, for example, the liquid processing out of the liquid processing section 4 so as to deliver the processed wafers W into the wafer vertical holding mechanism 21b. In the wafer transfer device 22, the wafers W are held by three chucks 28a to 28c.

Figure 3:
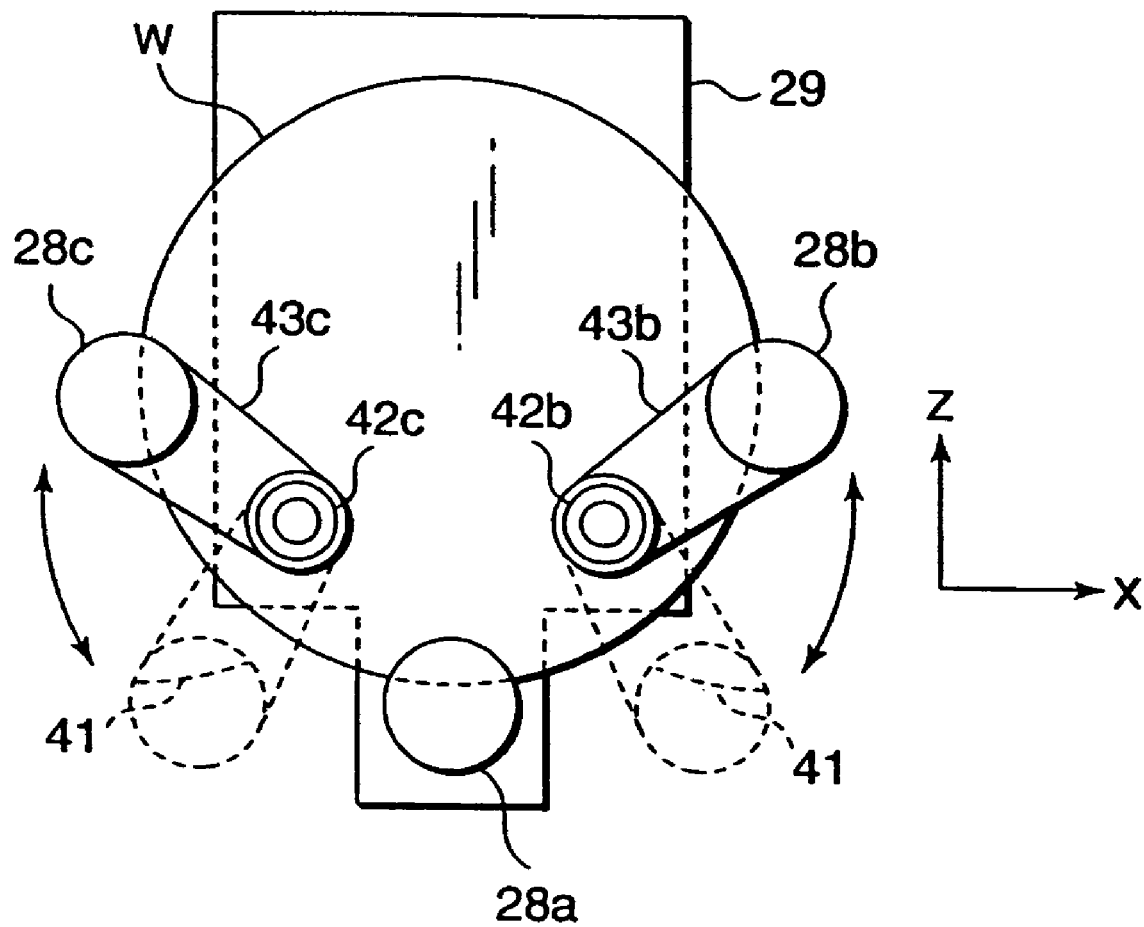
FIG. 3 is a front view showing the construction of the chuck portion in the wafer transfer device included in the liquid processing apparatus shown in FIG. 1.

FIG. 3 is a front view showing the positional relationship among the chucks 28a to 28c in the wafer transfer device 22. A groove portion 41, which is shown in detail in FIGS. 4A to 4C referred to herein later, for holding the wafers W at a pitch equal to the arranging pitch of the wafers W held in the wafer vertical holding mechanism 21b is formed in each of the chucks 28a to 28c. Among the chucks 28a to 28c, the central chuck 28a is fixed to a table 29 and holds the wafers W at their lowermost ends. The remaining two chucks 28b and 28c are joined to rotary shafts 42b, 42c via joining members 43b, 43c, respectively, and swung by a swinging mechanism (not shown) by a predetermined angle about the rotary shafts 42b, 42c in a manner to depict arcs on the Z-X plane. The chucks 28b, 28c are held open as denoted by dotted lines during delivery of the wafer W and is held closed as denoted by solid lines during transfer of the wafers W.

Under the open state of the chucks 28b and 28c denoted by the dotted lines, all the chucks 28a to 28c are aligned to form a straight line in the X-direction. Under this state, a washing treatment is applied to the chucks 28a to 28c by a chuck washing mechanism 26 described herein later. The position at which the chucks 28b and 28c hold the wafer W is not limited to the position shown in FIG. 3. It is possible for the chucks 28b and 28c to hold the wafer W at a position above or below the position shown in FIG. 3.

For the wafer delivery between the wafer vertical holding mechanism 21b and the wafer transfer device 22, the wafer vertical holding mechanism 21b is moved in the Y-direction toward the wafer transfer device 22. Further, various other methods can be employed for the wafer delivery between the mechanism 21b and the device 22. For example, it is possible to move the wafer vertical holding mechanism 21b in the Z-direction toward the wafer transfer device 22. It is also possible to arrange a transplanting mechanism (not shown) between the wafer vertical holding mechanism 21b and the wafer transfer device 22. In addition, it is possible to change the arranging pitch of the wafers W within the wafer transfer device 22 without changing the arranging pitch of the wafers W in the wafer transplanting device 21. In other words, it is possible to change or adjust the arranging pitch of the wafers W in any stage of the transfer process of the wafers W in the interface section 3 as far as the wafers W housed in two carriers C can be held at a predetermined pitch in the wafer transfer device 22.

The wafer transfer device 22 is movable along a guide rail 23 in the X-direction so as to enter the liquid processing section 4 and to retreat from the liquid processing section 4 such that the delivery of the wafers W can be performed between the wafer transfer device 22 and the wafer vertical holding mechanism 21b and the wafers W can be transferred into the liquid processing section 4. Also, in order to confirm whether or not a damage or a positional deviation takes place in the wafer W after the liquid processing, an inspecting sensor 27 for inspecting the arranging state of the wafers W is arranged in the position where the delivery of the wafer W is performed between the wafer vertical holding mechanism 21b and the wafer transfer device 22.

Incidentally, the arranging position of the inspecting sensor 27 is not particularly limited as far as it is possible to perform the inspection before the wafer W after the liquid processing is transferred into the wafer delivery device 19.

A parking area 9a is formed in the interface section 3 in a position sideward of the position where the delivery of the wafer W is performed between the wafer vertical holding mechanism 21b and the wafer transfer device 22. It is possible to hold, for example, the unprocessed wafers W in the parking area 9a. For example, by utilizing the time during the wafers W of a certain lot are subjected to a liquid processing or drying processing, it is possible to transfer the wafers W of another lot to be subjected to a liquid processing in the next stage to the parking area 9a by the wafer transfer device 22. As a result, it is possible to shorten the moving time of the wafer W into a liquid processing unit 7, compared with the case where the wafer W is transferred from, for example, the carrier stock section 6, thereby improving the through-put.

The liquid processing section 4 comprises the liquid processing unit 7, a drying unit 8 and a parking area 9b. These drying unit 8, liquid processing unit 7 and the parking area 9b are arranged in the order mentioned as viewed from the interface section 3. The wafer transfer device 22 is movable within the liquid processing section 4 along the guide rail 23 extending in the X-direction.

The unprocessed wafers W are held in the parking area 9b as in the parking area 9a. By utilizing the time during the wafers W of a certain lot are subjected to a liquid processing or drying processing, it is possible to transfer the wafers W of another lot to be subjected to a liquid processing in the next stage to the parking area 9a by the wafer transfer device 22. Since the parking area 9b is contiguous to the liquid processing unit 7, the moving time of the wafer W can be shortened in starting the liquid processing so as to improve the through-put.

As shown in FIG. 2, a first chemical solution tank 31, a first water washing tank 32, a second chemical solution tank 33, a second water washing tank 34, a third chemical solution tank 35 and a third water washing tank 36 are arranged in the liquid processing unit 7 in the order mentioned as viewed from the parking area 9b. The liquid processing unit 7 also includes a first transfer device 37 for transferring the wafer W between the first chemical solution tank 31 and the first water washing tank 32, a second transfer device 38 for transferring the wafer W between the second chemical solution tank 33 and the second water washing tank 34, and a third transfer device 39 for transferring the wafer W between the third chemical solution tank 35 and the third water washing tank 36.

Stored in the first chemical solution tank 31 is, for example, an SPM solution (i.e., a mixed solution consisting of concentrated sulfuric acid and hydrogen peroxide solution) heated at about 130° C. for removing an organic contaminant and metal impurities on the surface. Stored in the second chemical solution tank 33 is a chemical solution for removing the attached materials such as particles including, for example, a SC-1 solution (i.e., a mixed solution consisting of ammonia and hydrogen peroxide solution). Further, stored in the third chemical solution tank 35 is an etchant for etching the oxide film formed on the surface of the wafer W including, for example, a dilute hydrofluoric acid. In addition to the dilute hydrofluoric acid, it is also possible to use a mixture of hydrofluoric acid and ammonium fluoride (i.e., buffered hydrofluoric acid (BHF)), as the etchant.

The chemical solutions attached to the wafers W by the liquid processing performed in the first to third chemical solution tanks 31, 33 and 35 are removed in the first to third water washing tanks 32, 34 and 36, respectively, by various water washing means such as an overflow rinsing or a quick dump rinsing.

The first transfer device 37 includes a driving mechanism movable in the Z-direction. The wafer W delivered from the wafer transfer device 22 is moved downward by the first transfer device 37 so as to be dipped in the first chemical solution tank 31 and pulled up a predetermined time later. Then, the wafer W is moved in parallel in the X-direction so as to be dipped in the first water washing tank 32 and, then, pulled up a predetermined time later. The wafer W processed in the first water washing tank 32 is once returned to the chucks 28a to 28c of the wafer transfer device 22 and, then, transferred from the wafer transfer device 22 into the second transfer device 38. The second and third transfer devices 38 and 39 are equal to the first transfer device 37 in construction and operation. Incidentally, it is desirable for the delivery of the wafer W between the wafer transfer device 22 and the first to third transfer devices 37 to 39 to be carried out above the first to third water washing tanks 32, 34 and 36, respectively. Where the wafer transfer device 22 is stopped above the first to third chemical solution tanks 31, 33, 35, it is possible for the wafer transfer device 22 to be contaminated with, for example, the vapor of the chemical solution so as to be damaged.

A water washing tank 24 and a chuck washing mechanism 26 for washing the chucks 28a to 28c of the wafer transfer device 22 are arranged in the drying unit 8, and a drying chamber (not shown) supplied with, for example, the vapor of isopropyl alcohol (IPA) for drying the wafer W is arranged above the water washing tank 24. Also, a transfer device 25 for transferring the wafer W between the water washing tank 24 and the drying chamber is arranged in the drying unit 8. The wafer W washed with water in the water washing tank 24 is pulled up by the transfer device 25 so as to be dried by IPA in the drying chamber. The transfer device 25 is equal in construction to the first transfer device 37, etc., except that the transfer device 25 is incapable of movement in the X-direction, and the delivery of the wafer W is performed between the transfer device 25 and the water transfer device 22.

Figure 4:
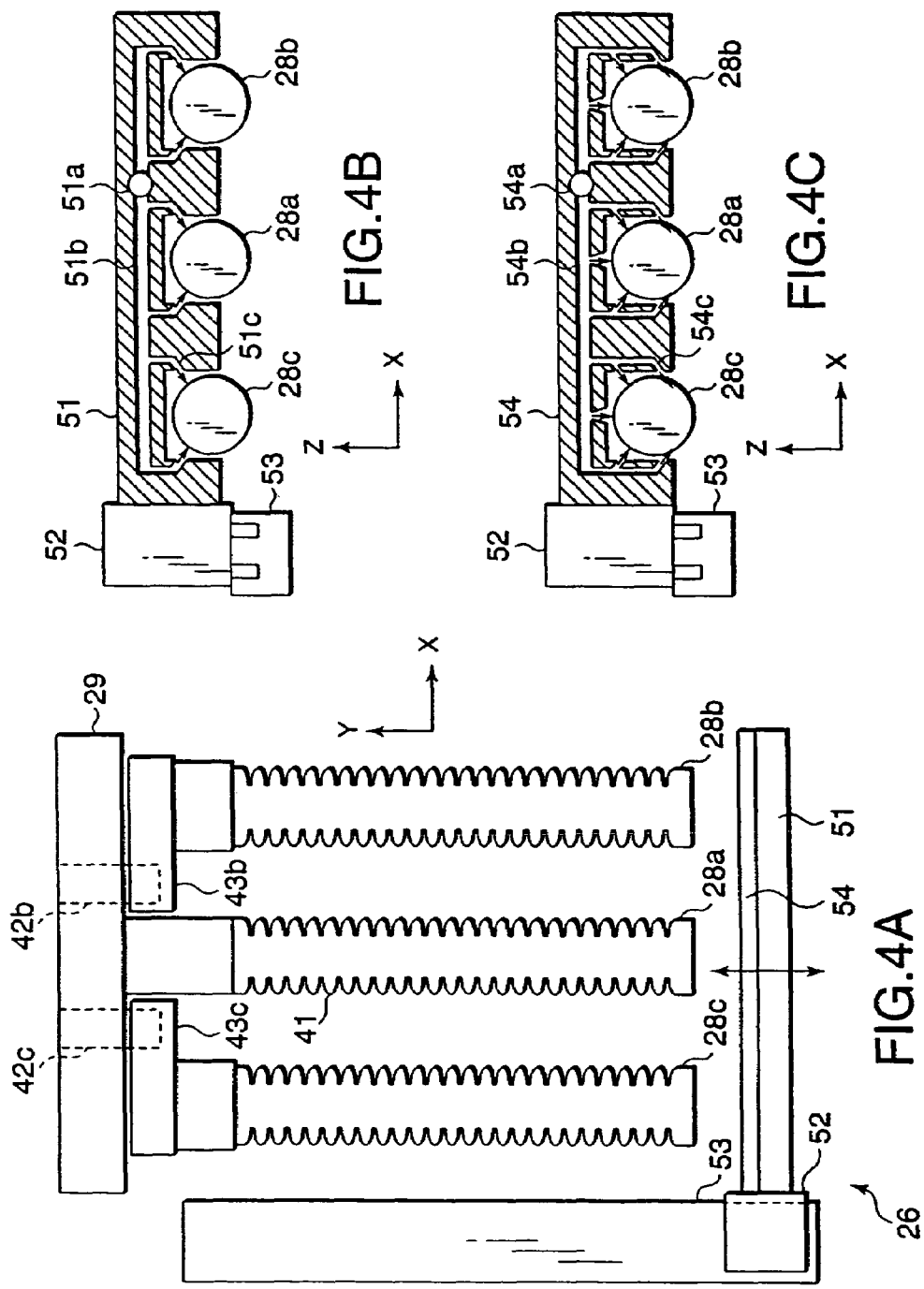
FIG. 4A is a plan view showing the construction of the chuck washing mechanism shown in FIG. 3.
FIGS. 4B and 4C are cross sectional views collectively showing the construction of the chuck washing mechanism shown in FIG. 3.

FIGS. 4A to 4C collectively show the construction of the chuck washing mechanism 26, wherein FIG. 4A is a plan view showing the chuck washing mechanism 26, FIG. 4B is a cross sectional view showing a washing nozzle 51, and FIG. 4C is a cross sectional view showing a drying nozzle 54. The chuck washing mechanism 26 comprises the washing nozzle 51, the drying nozzle 54, a nozzle holding section 52, a guide 53, and a driving mechanism such as an air cylinder (not shown) for moving the nozzle holding section 52 along the guide 53 in the Y-direction. The washing nozzle 51 is provided with recesses shaped to cover the upper portions of the chucks 28a to 28c arranged side by side in the X-direction. Also, formed within the washing nozzle 51 are a washing solution supply passageway 51a, a washing solution discharge port 51c, and a washing solution branched supply passageway 51b communicating with the washing solution supply passageway 51a and with the washing solution discharge port 51c.

A washing solution is supplied from a washing solution supply source (not shown) into the washing solution supply passageway 51a, and the washing solution is spurted at a predetermined angle from the washing solution discharge port 51c toward the groove portion 41 formed in the chucks 28a to 28c. FIG. 4B shows that the washing solution discharge ports 51c are arranged at different angles depending on the chucks 28a to 28c that are to be washed. These discharge ports 51c are arranged at different angles in view of the position of the groove portion 41 when the chucks 28b and 28c are moved down to the height equal to the height of the chuck 28a and in view of the diffusing direction of the washing solution. The arranging angles of the washing water discharge ports 51c are not limited to those shown in FIG. 4B. It is possible to arrange the washing solution discharge ports 51c at suitable angles in view of the shapes of the chucks 28a to 28c, and the shape and the forming position of the groove portion 41.

The drying nozzle 54 is close in construction to the washing nozzle 51. Specifically, formed within the drying nozzle 54 are a drying gas supply passageway 54a, a drying gas discharge port 54c and a drying gas branched supply passageway 54b communicating with the drying gas supply passageway 54a and with the drying gas discharge port 54C. The positions and the number of the drying gas discharge ports 54c are determined appropriately such that the washing solution attached to the chucks 28a to 28c are blown away by the drying gas discharged from the drying gas discharge ports 54c so as to dry the entire chucks 28a to 28c and, thus, are not limited to the positions and the number shown in FIG. 4C. Incidentally, it is possible to permit the drying gas to be discharged from the washing nozzles 51 for drying the chucks 28a to 28c without arranging the drying nozzle 54.

For operating the chuck washing mechanism 26, the chucks 28a to 28c are washed first by moving the washing nozzle 51 and the drying nozzle 54 from the state shown in FIG. 4A toward the table 29 at a predetermined speed while discharging the washing solution. Then, if the washing nozzle 51 is moved to reach a predetermined position on the side of the table 29 after completion of the discharge of the washing solution against the entire region of the groove portion 41, the position of the washing nozzle 51 is moved at a predetermined speed toward the tip portions of the chucks 28a to 28c while discharging a drying gas such as a nitrogen gas from the drying gas discharge ports 54c so as to dry the chucks 28a to 28c. In this fashion, the chucks 28a to 28c are washed and dried. It should be noted that the drying gas is blown from the side of the table 29 toward the tip portions of the chucks 28a to 28c for drying the chucks 28a to 28c. As a result, it is possible to prevent the washing solution blown by the drying gas from being attached to, for example, the table 29.

Figure 5:
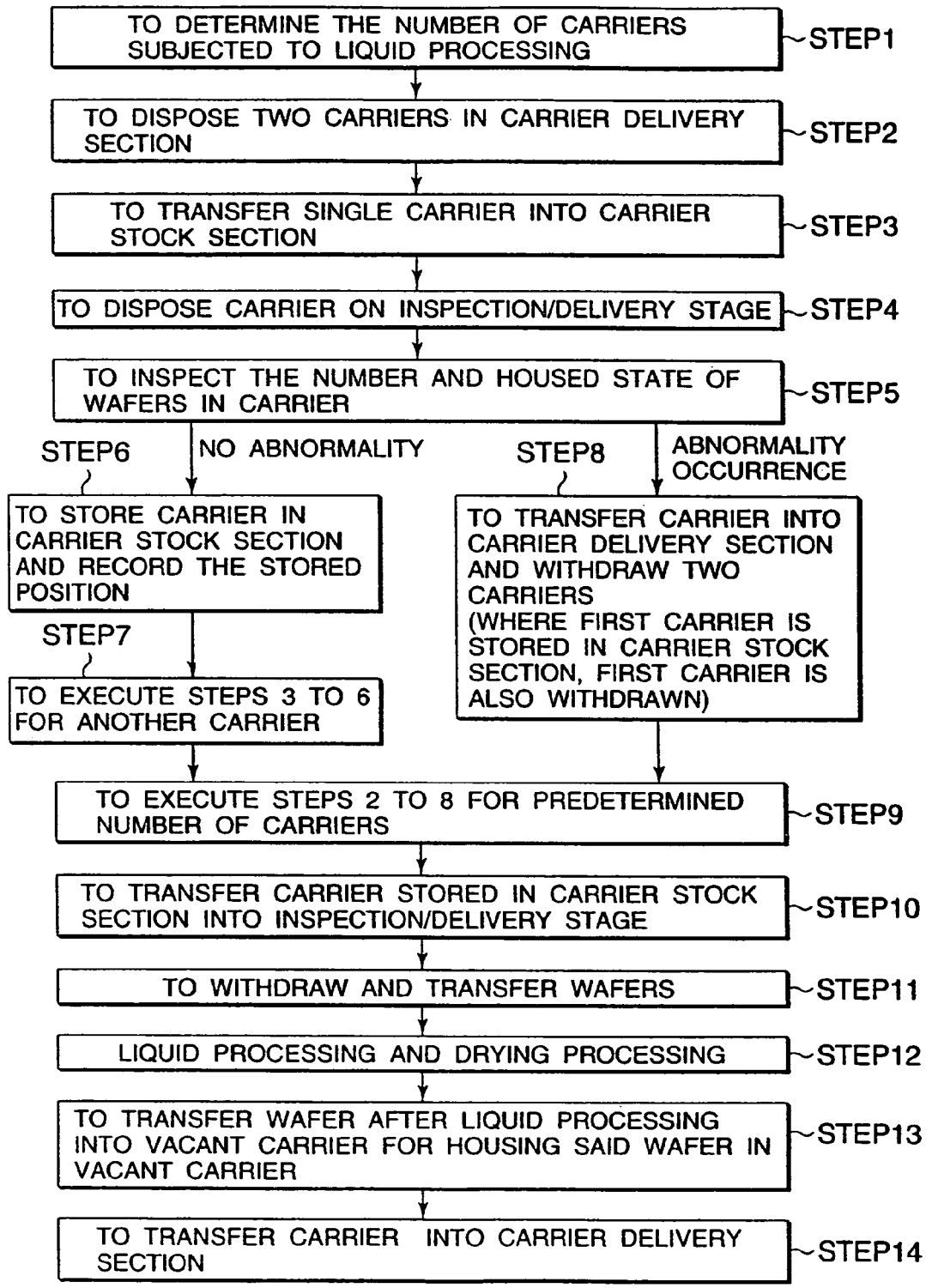
FIG. 5 is a flow chart showing the liquid processing method according to one embodiment of the present invention.

The operation of the liquid processing apparatus 1 of the construction described above will now be described with reference to FIG. 5 showing a flow chart of the liquid processing. In the first step, the number of wafers to be processed, i.e., the number of carriers C, is determined (step 1). In this example, two carriers C each housing 25 wafers W in a horizontal state forms a single lot, and 5 lots of wafers W are subjected to a liquid processing.

Two carriers C1 and C2 forming a single lot are disposed on the carrier delivery section 5 (step 2). Then, the shutter 14 is opened, and the carrier C1 is transferred into the carrier stock section 6 by using the carrier transfer device 12 (step 3). It is desirable to close the shutter 14 after the carrier C1 is transferred into the carrier stock section 6 so as to prevent dust, etc. from entering the carrier stock section 6.

The carrier C1 transferred into the carrier stock section 6 is disposed on the inspection/delivery stage 5 (step 4), followed by opening the lid of the carrier C1 by the lid opening/closing mechanism 17 and subsequently opening the window portion 16, thereby inspecting the number and the housed state of the wafers W housed in the carrier C1 by the wafer inspecting device 18 (step 5).

Where an abnormality has not been detected in the housed state of the wafers W in the carrier C1, the window portion 16 and the lid of the carrier C1 are closed, and the carrier C1 is disposed on any of the carrier holding members 13 arranged in the carrier stock section 6. The disposed position of the carrier C1 is stored in the carrier transfer device control section 90 (step 6). Then, the carrier C2 is introduced into the carrier stock section 6 in accordance with steps 3 to 6 described above so as to inspect the housed state of the wafers W in the carrier C2. Where an abnormality has not been found, the carrier C2 is also disposed on any of the carrier holding members 13, and the disposed position is stored in the carrier transfer device control section 90.

Where an abnormality has been found in the housed state of the wafers W in the carrier C1 in step 5, a liquid processing is not applied to the wafers W in the carrier C1, and the carrier C1 is returned to the carrier delivery section 5 so as to remove the carriers C1 and C2 from the carrier delivery section 5 (step 8). Also, where an abnormality has been found in the housed state of the wafers W in the carrier C2 in step 5, the carrier C2 is returned to the carrier delivery section 5. At the same time, the carrier C1, which was temporarily stored, is also returned to the carrier delivery section 5. Then, the carriers C1 and C2 are removed from the carrier delivery section 5 (step 8). The operations of steps 2 to 8 described above are also applied to the remaining carriers C, i.e., carriers C3 to C10, (step 9).

Since a predetermined time is required for the inspection of the number and housed state of the wafers W in the carrier C1, it is desirable to operate the carrier transfer device 12 to transfer successively the carriers C2 to C10 to predetermined positions within the carrier stock section 6 by utilizing the inspection time of the wafers W in stock C1 such that, as soon as the inspection of the wafers W in the carrier C1 is finished, the carrier C2 housing the wafers W that are to be inspected in the next step are transferred from the stored position in the carrier stock section 6 into the inspection/delivery stage 15.

It was customary in the past that, where an abnormality has not been found in the wafers W housed in the carrier C1, these wafers were transferred by the wafer delivery device 19 from the carrier C1 into the wafer vertical holding mechanism 21b, and the transfer of the wafers W housed in the carrier C2 was awaited. In the conventional method, however, it was necessary to return the wafers W transferred to the wafer vertical holding mechanism 21b back to the carrier delivery section 5 for housing these wafers W in the carrier C1 in the case where it was necessary to suspend the liquid processing because, for example, the number of wafers W in the carrier C2 was insufficient. As a result, the processing time was delayed.

Also, in the case where, for example, the number of wafers W housed in the next carrier C3 is insufficient, though the liquid processing was finished without problem in respect of the wafers W housed in the carriers C1 and C2, it is impossible to apply the liquid processing to the wafers W in the carriers C3 and C4, resulting in failure to apply the liquid processing to the wafers in the 10 carriers C that were initially planned to be subjected to the liquid processing. In this case, it is necessary to prepare new wafers or to change the process conditions for the processing of the wafers W in the 8 carriers C.

The occurrence of such a situation is undesirable in terms of the supervision of the production.

In the present invention, the state of the wafers W housed in all the carriers C is inspected in advance in the steps 1 to 9 described above and, then, the liquid processing is started, making it unnecessary to return the wafers W. Also, where the number of wafers W is insufficient, the process conditions are changed in advance so as to facilitate the supervision of the production.

After a predetermined number of carriers C housing the wafers W to be processed are stored in the carrier stock section 6 by the operations up to step 9, the liquid processing of the wafers W is started. Since the position of the carrier C1 is stored in the carrier transfer device control section 90, the carrier transfer device 12 is operated to transfer the carrier C1 from the stored position to the inspection/delivery stage 15 (step 10). Then, the lid of the carrier C1 is opened and the window portion 16 is also opened. Under this condition, the arm 19a for transferring the unprocessed wafer, which is included in the wafer delivery device 19, is operated so as to take the wafers W out of the carrier C1 and to transfer these wafers W to a predetermined position of the interface section 3 (step 11). Incidentally, when the wafers W are taken out of the carrier C1, the inspection by the wafer inspecting device 18 need not be performed because the state of the wafers W in the carrier C1 is confirmed in advance.

However, it is possible to perform the inspection by the wafer inspecting device 18 for reconfirmation.

After the wafers W were taken out of the carrier C1, the window portion 16 and the lid of the carrier C are closed in the carrier stock section 6. Under this condition, the carrier transfer device 12 is operated so as to return the vacant carrier C1 from the inspection/delivery stage 15 back to the original storing position. Also, the carrier C2 is moved to the inspection/delivery stage 15. It should also be noted that, in the interface section 3, the wafer W held by the arm 19a is delivered to the posture changing mechanism 21a. The posture of the wafer W is changed in the posture changing mechanism 21a and, then, the wafer W is delivered to the wafer vertical holding mechanism 21b. The arm 19a is then rendered capable of gaining access to the carrier C2 disposed on the inspection/delivery stage 15 so as to take the wafers W out of the carrier C2 and deliver the wafers thus taken out to the posture changing mechanism 21a. The posture of the wafers W are changed in the posture changing mechanism 21a and, then, the wafers W are delivered to the wafer vertical holding mechanism 21b. In this fashion, 50 wafers W are arranged in the wafer vertical holding mechanism 21b at a pitch half the arranging pitch of the wafers W housed in the carriers C1 and C2.

The wafer vertical holding mechanism 21b is slid toward the wafer transfer device 22 so as to transplant the wafers W onto the chucks 28a to 28c. Since it is possible to transfer the wafers W, which are to be subjected to the liquid processing in the next step, into the wafer vertical holding mechanism 21b after the wafers W are transplanted into the wafer transfer device 22, it is desirable to transfer the wafers W in the carriers C3 and C4 into, for example, the parking area 9b after initiation of the liquid processing applied to the wafers housed in the carriers C1 and C2 as described herein later in preparation for the next operation.

The wafer transfer device 22 holding the wafers W is moved along the guide rail 23 to the position of the first chemical solution tank 31 or the first water washing tank 32 included in the liquid processing unit 7 so as to transplant the wafers W onto the first transfer device 37. Then, the liquid processing of the wafer W is started (step 12). The liquid processing of the wafer W is carried out by, for example, the dipping of the wafer W in the first chemical solution tank 31, followed by the water wash in the first water washing tank 32, the dipping of the wafer W in the second chemical solution tank 33, followed by the water wash in the second water washing tank 34, and the dipping of the wafer W in the third chemical solution tank 35, followed by the water wash in the third water washing tank 36, in the order mentioned.

After initiation of such a liquid processing of the wafer W, the waiting time of the wafer transfer device 22 is generated in the period between, for example, the dipping of the wafer W in the first chemical solution tank 31 and the water wash in the first water washing tank 32. Therefore, the wafer W that is to be processed in the nest step is received from the wafer vertical holding mechanism 21b so as to be transferred to the parking area 9b by utilizing the waiting time noted above. Then, after the wafer W that was subjected first to the liquid processing is transplanted from the first water washing tank 32 into the second transfer device 38, the next wafer W disposed in the parking area 9b is transplanted into the first transfer device 37 so as to apply the liquid processing to the wafer W in the first chemical solution tank 31.

The particular operation described above permits shortening the tact time and improving the through-put. The wafer W can be transferred to the parking area 9b in view of the timing of returning the wafer after the liquid processing back to the carrier stock section 6. It is possible to dispose the wafer W that is to be processed in the next step in the parking area 9a. It is also possible to dispose the wafer W that is to be processed in the next step in the parking area 9b and to dispose the wafer W that is to be processed after the processing in the next step in the parking area 9a.

The wafer W after the processing in the liquid processing unit 7 is once transplanted to the wafer transfer device 22 and, then, to the transfer device 25 of the drying unit 8 for the drying treatment. The wafer W after the drying treatment is transplanted into the wafer transfer device 22 so as to be returned back to the interface section 3. Then, the state of the wafer W is inspected by the inspecting sensor 27. If an abnormality has been detected in the state of the wafer W, a countermeasure is taken. For example, a maintenance is performed by stopping the liquid processing apparatus 1. In this fashion, it is possible to prevent the damage done to the wafer transfer device 22 and the wafer vertical holding mechanism 21b as well as the breakage of the wafer W that are caused by the erroneous delivery of the wafer W into the wafer vertical holding mechanism 21b.

The wafer W returned to the interface section 3 after completion of the liquid processing can be housed in the vacant carriers C1 and C2 disposed on the inspection/delivery stage 15 by the procedures opposite to those in the process of transferring the unprocessed wafer W from the carrier stock section 6 into the wafer transfer device 22 (step 13). The carriers C1 and C2 housing the wafers W after the liquid processing are transferred into the carrier delivery section 5 and, then, to the next step (step 14). In the processing in the steps 10 to 14 described above, the wafers W that are to be subjected to the liquid processing are successively transferred into the liquid processing section 4 in view of the timing of the returning transfer of the wafer W after the liquid processing. After completion of the liquid processing of the wafers W in all the carriers C1 to C10, the processing of the wafers W in another lot is started.

In the case of using another carrier C differing from the carrier C housing the wafers W before the liquid processing in housing the wafers W after the liquid processing in the carrier C, the vacant carrier C from which the wafers W have been taken out is transferred into the carrier delivery section 5 and a substitute carrier C is transferred into the carrier stock section 6. It is also possible to transfer a vacant carrier C into the carrier stock section 6 for the temporary storing in the carrier stock section 6 and, then, to transfer the vacant carrier C into the carrier delivery section 5 in view of the time during which the carrier transfer device 12 need not be operated, followed by transferring another carrier C for housing the wafers W after the liquid processing into the carrier stock section 6. The transfer and storage of the carrier C for housing the wafers W after the liquid processing in the carrier stock section 6 can be performed by utilizing the time before the wafers W after the liquid processing are returned to the inspection/delivery stage 15.

Figure 6:
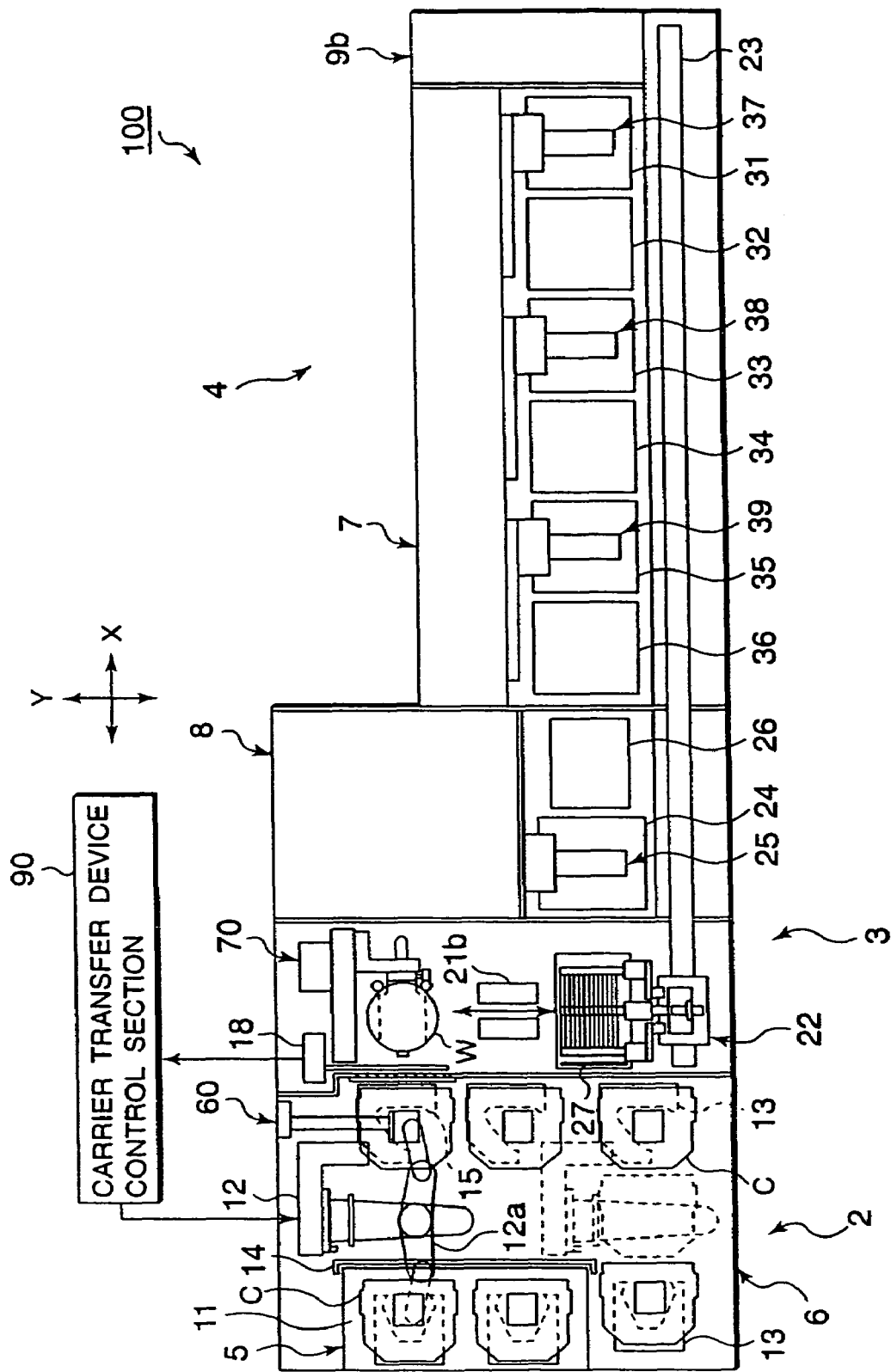
FIG. 6 is a plan view showing the liquid processing apparatus according to another embodiment of the present invention.

A liquid processing apparatus according to another embodiment of the present invention will now be described. FIG. 6 is a plan view showing the construction of a liquid processing apparatus 100 according to another embodiment of the present invention. The liquid processing apparatus 100 differs from the liquid processing apparatus 1 described previously in the constructions of the carrier stock section 6 and the interface section 3 and equal to the liquid processing apparatus 1 in the constructions of the other portions (units). To be more specific, the liquid processing apparatus 100 differs from the liquid processing apparatus 1 in that, in the apparatus 100, a carrier retreat device 60 is newly arranged in the carrier stock section 6, and that a wafer delivery/posture changing device 70 is arranged in the interface section 3 in place of the wafer delivery device 19 and the posture changing mechanism 21a in the wafer transplanting device 21. Such being the situation, the carrier retreat device 60 and the wafer delivery/posture changing mechanism 70 will now be described.

Figure 7C:
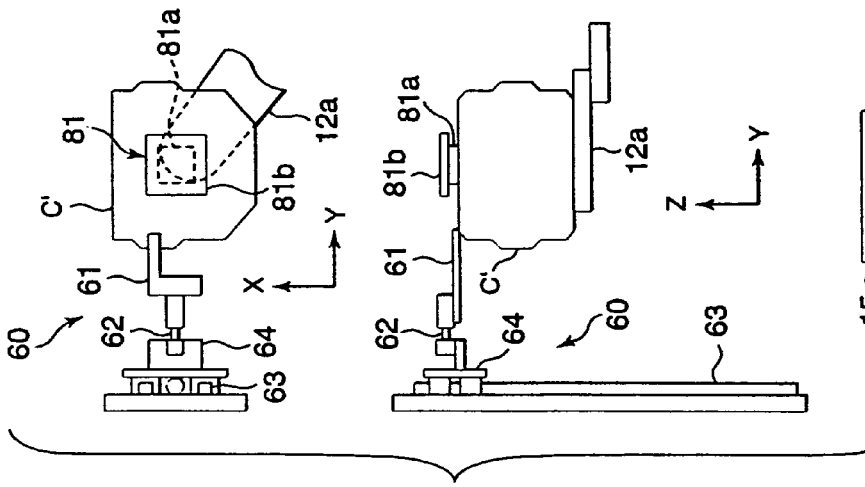
FIGS. 7A to 7C collectively show the construction of a carrier retreat device used in the liquid processing apparatus of the present invention.
Figure 7B:
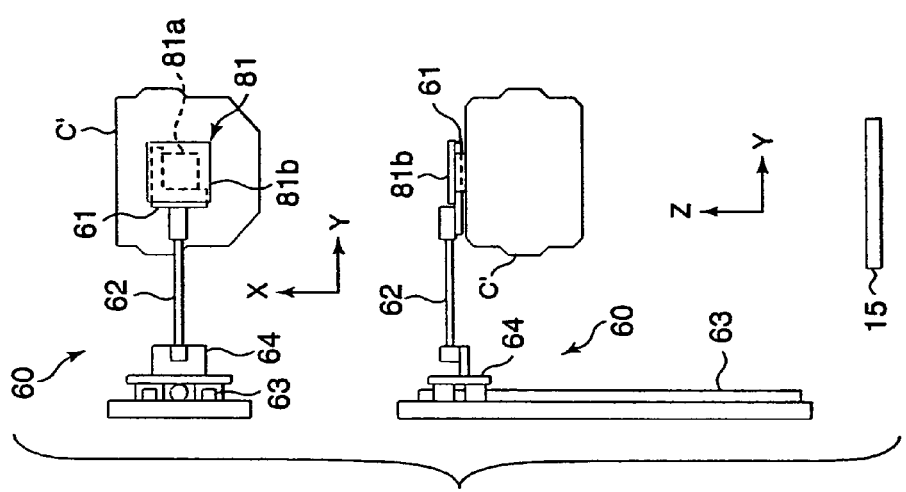
Figure 7A:
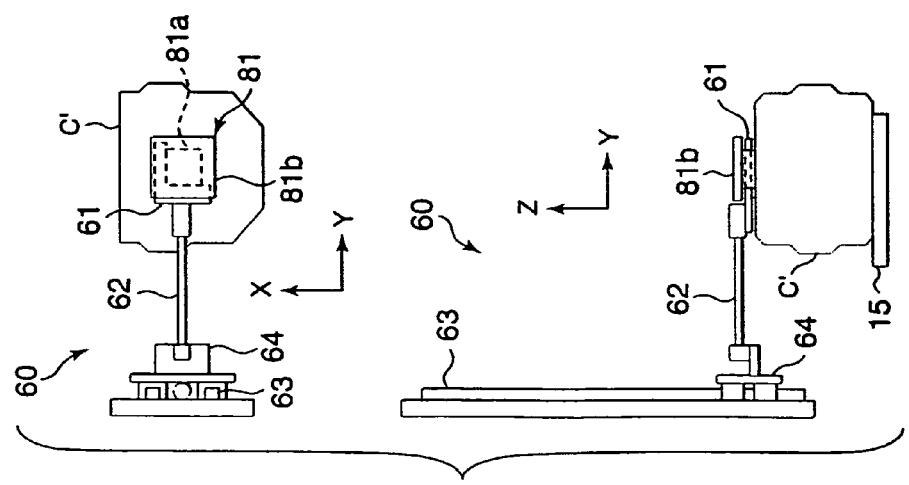

FIGS. 7A to 7C collectively show the construction of the carrier retreat device 60 arranged in the carrier stock section 6. The carrier retreat device 60 is a mechanism for temporarily retreating the carrier C disposed on the inspection/delivery stage 15 into a region above the inspection/delivery stage 15. In the following description, the position of the carrier C disposed on the inspection/delivery stage 15 is called an inspecting position, and a position above the inspecting position, to which the carrier C is moved upward by the carrier retreat device 60 for the temporary storage, is called a retreat position. The retreat position is not limited to a region above the inspecting position. For example, it is also possible for a region sideward of the inspecting position to constitute the retreat position.

The carrier retreat device 60 comprises a carrier holding section 61 for holding the carrier C, a slide arm 62 for sliding the carrier holding section 61 in the Y-direction, a guide 63 mounted to the wall of the carrier stock section 6 and extending in the Z-direction, and an arm holding section 64 holding the slide arm 62 and slidable along the guide 63 in the Z-direction. It is possible to use, for example, an air cylinder or a belt transfer mechanism as a driving mechanism (not shown) of the slide arm 62 and the arm holding section 64.

In the liquid processing apparatus 100, a carrier C' having a projecting portion 81, which is substantially T-shaped in cross section, formed on the upper surface as shown in FIGS. 7A to 7C is used as the carrier C on condition that the carrier retreat device 60 is used. The projecting portion 81 comprises a columnar section 81a and an umbrella section 81b.

The carrier holding section 61 is substantially L-shaped. If the slide arm 62 is operated, the carrier holding section 61 gains access in the Y-direction to the projecting portion 81 on the upper surface of the carrier C' in the inspecting position so as to be inserted into the clearance between the umbrella section 81b and the upper surface of the carrier C', as shown in FIG. 7A. Then, if the arm holding section 64 is moved upward in the Z-direction along the guide 63 under the state that the carrier holding section 61 is kept inserted into the clearance between the umbrella section 81b and the upper surface of the carrier C', as shown in FIG. 7B, the carrier holding section 61 abuts against the umbrella section 81b so as to move upward the carrier C' in the Z-direction, thereby moving the carrier C' to the retreat position. Incidentally, the shape of the carrier holding section 61 is not limited to a substantial L-shape. For example, it is possible for the carrier holding section 61 to be substantially U-shaped as far as the carrier holding section 61 can be inserted into the clearance between the umbrella section 81b and the upper surface of the carrier C'.

As shown in FIG. 7C, the arm 12a of the carrier transfer device 12 gains access to the lower side of the carrier C' in the retreat position so as to hold the carrier C'. If the carrier holding section 61 is slightly moved downward such that the carrier holding section 61 does not abut against the umbrella section of the projecting portion 81, or if the slide arm 62 is shrunk by slightly moving upward the arm 12a of the carrier transfer device 12, it is possible to withdraw the carrier holding section 61 from below the umbrella section 81b. The carrier C' held by the arm 12a of the carrier transfer device 12 is transferred to the carrier holding member 13 in a predetermined position.

Figure 8A:
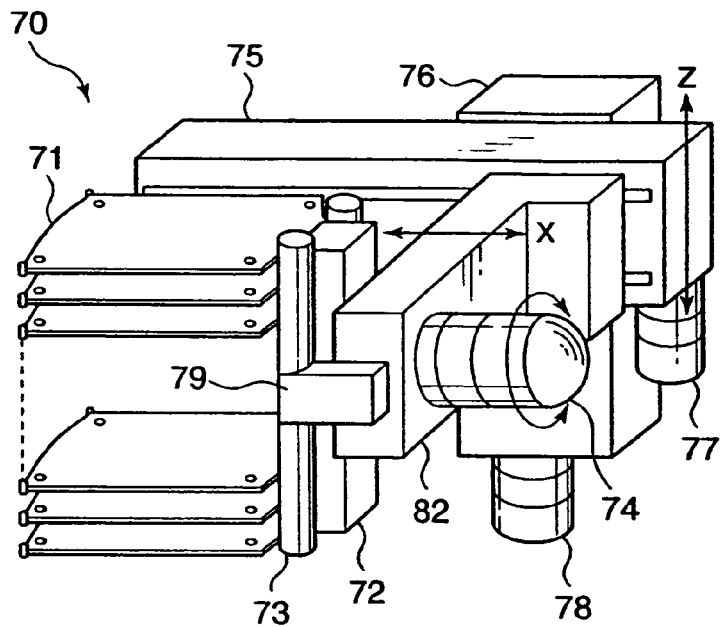
FIGS. 8A and 8B collectively show the construction and the operating mode of a wafer transfer/posture changing device used in the liquid processing apparatus shown in FIG. 6.
Figure 8B:
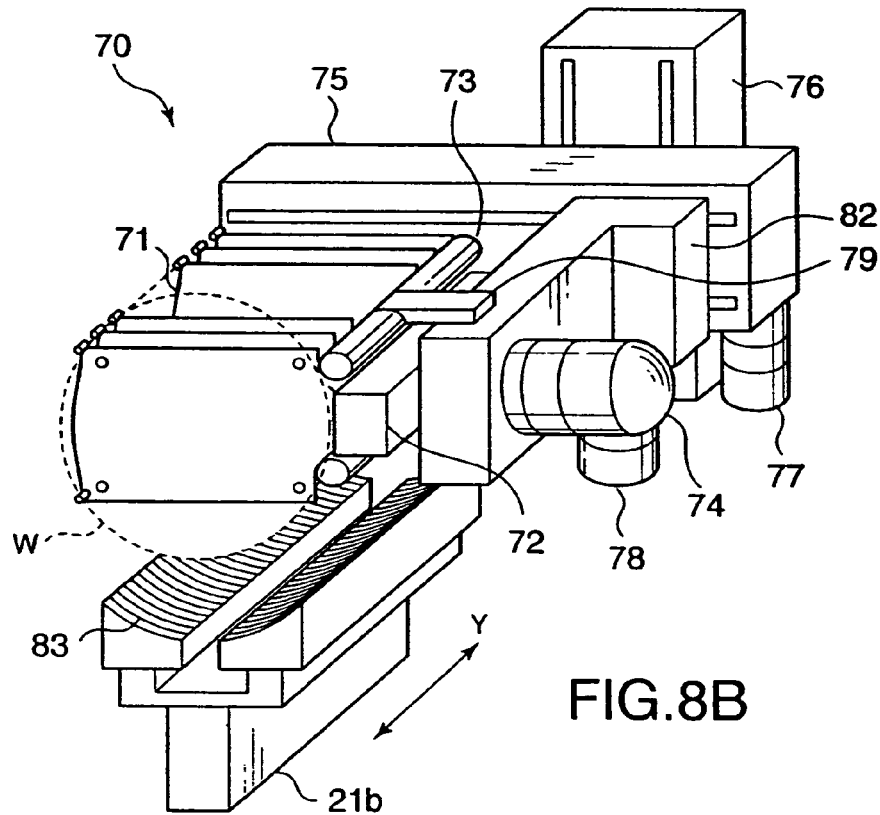

The wafer delivery/posture changing device 70 arranged in the interface section 3 will now be described in detail. FIGS. 8A and 8B collectively show the construction and operation of the wafer delivery/posture changing device 70. The wafer delivery/posture changing device 70 comprises a plurality of support plates 71 arranged substantially in parallel a predetermined distance apart from each other, a plate holding section 72 for holding the support plates 71, a wafer holding transfer guide 73 movably mounted on the side of the plate holding section 72 of the support plates 71, a plate swinging mechanism 74 for collectively swinging the plural support plates 71 by a predetermined angle, a plate sliding mechanism 75 for sliding the support plates 71 in the X-direction, and a lift mechanism 76 for sliding the plate sliding mechanism 75 in the Z-direction.

The plate holding section 72 is joined to the plate sliding mechanism 75 by a joining tool 82. In FIGS. 8A and 8B, a reference numeral 77 denotes a driving actuator for the plate sliding mechanism 75, a reference numeral 78 denotes a driving actuator for the lift mechanism 76, and a reference numeral 79 denotes a driving actuator for the wafer holding transfer guide 73. The driving actuator 79 permits the two wafer holding transfer guides 73 to be slid simultaneously in the X-direction.

Figure 9:
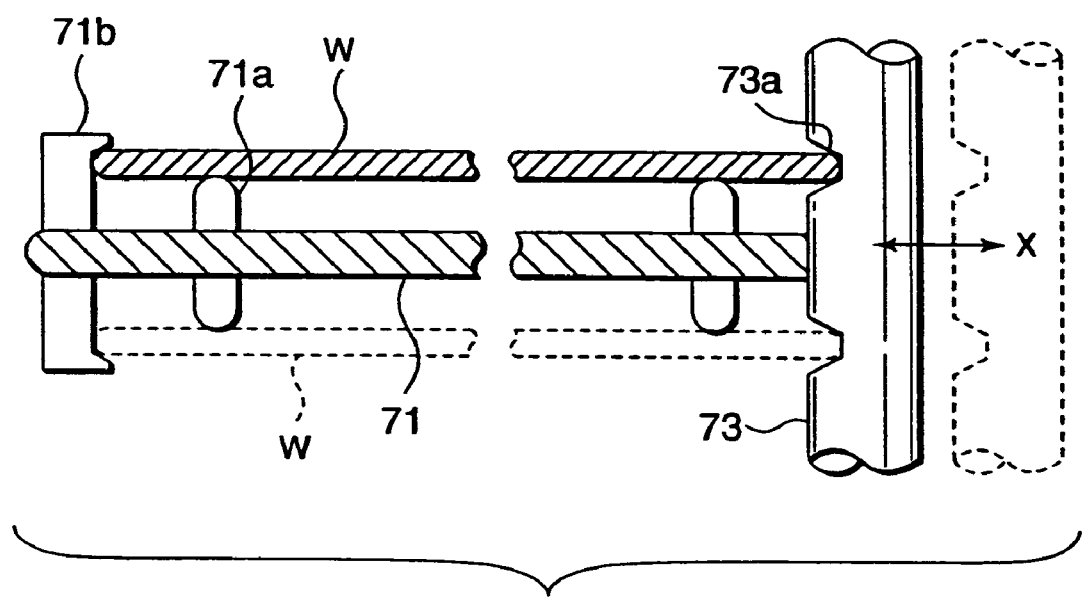
FIG. 9 is a cross sectional view showing the construction of a support plate included in the wafer transfer/posture changing device shown in FIGS. 8A and 8B.

FIG. 9 is a cross sectional view showing the construction of the support plate 71. A support pin 71a abutting against the wafer W is formed in a predetermined position on the front and back surfaces of the support plate 71, and a holding pin 71b is formed in substantially the tip portion of the support plate 71 on the side of the carrier stock section 6. The tip of the holding pin 71b is bent toward the plate holding section 72. The wafer holding transfer guide 73 is slidable in the X-direction, and grooves 73a for holding the wafers W are formed in the wafer holding transfer guide 73 on the side of the support plate 71. These grooves 73 are formed at the positions and the pitch conforming with the positions and the pitch of the wafers W held by the support plates 71.

The front and back sides of the support plate 71 are in symmetry in construction. Under the ordinary state, the wafer W is held by the surface caused to form the upper surface by the plate swinging mechanism 74. It follows that it is possible to use, for example, the upper surface of the support plate 71 shown in FIG. 9 for transferring the unprocessed wafer W, and the lower surface of the support plate 71 shown in FIG. 9 to swing the support plate 71 to cause the lower surface to form the upper surface for transferring the wafer W after the liquid processing.

The wafer W under an abutting state against the support pin 71a can be taken out of the carrier C' by operating the plate sliding mechanism 75 to permit the support plate 71 to be inserted into the carrier C' in the inspecting position and slightly moving upward the support plate 71 by operating the lift mechanism 76, followed by withdrawing the support plate 71 from the carrier C' from the particular state by operating the plate sliding mechanism 75. If the wafer holding transfer guide 73 is slid from this state toward the tip portion of the support plate 71, the wafer W is held by the holding pin 71b and the groove portion 73a formed in the wafer holding transfer guide 73. It follows that the movement of the wafer W is limited not only in the horizontal direction but also in the Z-direction.

Even if the plate swinging mechanism 74 is driven to swing the support plate 71 holding the wafer W by 90°, the wafer W is not disengaged from the support plate 71 and, thus, is not dropped. Also, since no member abuts against the lower end portion of the wafer W that is held substantially vertical, it is possible to transplant easily the wafer W onto the wafer vertical holding mechanism 21b. In this case, the wafers W are held in the wafer vertical holding mechanism 21b at the pitch equal to the arranging pitch of the wafers W within the carrier C'.

The wafers W can be transplanted from the wafer delivery/posture changing device 70 to the wafer vertical holding mechanism 21b by, for example, moving downward the plate sliding mechanism 75, etc. and the support plate 71 by operating the lift mechanism 76 so as to store the wafers W in the predetermined grooves 83 formed in the wafer vertical holding mechanism 21b, and by moving upward the support plate 71 after the holding of the wafers W is released by retreating the wafer holding transfer guide 73. The wafers W after the liquid processing can be transplanted from the wafer vertical holding mechanism 21b to the wafer delivery/posture changing device 70 by the procedure opposite to that described above. However, careful attentions should be paid to the situation that the surface of the support plate 71 facing the wafer W form the predetermined surface for transferring the wafers W after the liquid processing.

It should be noted that the wafer vertical holding mechanism 21b is slidable in the Y-direction. Therefore, the wafers W housed in two carriers C' can be held in the wafer vertical holding mechanism 21b at a pitch half the arranging pitch of the wafers W within the carrier C', if the wafer vertical holding mechanism 21b is slid in the Y-direction by a distance equal to half the arranging pitch of the wafers W within the carrier C' when the wafers W in a certain carrier C' are transplanted to the wafer vertical holding mechanism 21b and, then, the wafers W in another carrier C' are transplanted to the wafer vertical holding mechanism 21b. The wafers W are transplanted between the wafer vertical holding mechanism 21b and the wafer transfer device 22 as in the liquid processing apparatus 1.

In the case of using the wafer delivery/posture changing device 70, it is possible to decrease the arranging area of the apparatus, compared with the case of using the wafer delivery device 19 and the posture changing device 21a, making it possible to decrease the footprint. Also, since the number of times of delivering the wafer W is decreased, it is possible to prevent the damage done to the wafer W and to the apparatus by the erroneous delivery.

How to transfer the carrier C' within the carrier stock section 6 in the case of using the carrier retreat device 60 will now be described with reference to FIGS. 10A to 10. The following description covers the case of transferring two carriers C', i.e., carriers C1' and C2', housing the wafers because the liquid processing of the wafer W has not yet been started, and two additional carriers C', i.e., carriers C3' and C4', which are rendered vacant because the liquid processing has already been started, under the state that at least four carriers C' have already been transferred by the carrier transfer device 12 into the carrier stock section 6 so as to be disposed on the carrier holding members 13 in predetermined positions and the liquid processing has already been started in respect of the wafers W housed in predetermined carriers C'.

It is assumed that the wafers W housed in the carriers C1' and C2' have already been inspected to confirm that there is no abnormality when these carriers C1' and C2' are transferred into the carrier stock section 6. For facilitating the description, FIGS. 10A to 10I show that the carriers C1' to C4' are positioned close to each other, and that the storing positions of the carriers C1' to C4' are close to the inspection/delivery stage 15. However, these drawings do not show the actual storing positions of the carriers C1' to C4'. Also, all the storing positions of the carriers C1' to C4' are not close to the inspection/delivery stage 15. In other words, the carriers C1' to C4' are stored in the optional carrier holding members 13.

FIG. 10A shows the initial state. From this state, the carrier C1' is transferred by the carrier transfer device 12 to the inspection/delivery stage 15 in order to transfer the wafers W housed in the carrier C1' into the interface section 3 and, then, the wafers W are inspected again by the wafer inspecting device 18 by opening the lid of the carrier C1' and the window portion 16 (FIG. 10B). Since the inspection takes a predetermined time, the carrier transfer device 12 transfers the carrier C2' to a position close to the inspecting position by utilizing the inspecting time (FIG. 10B).

If it has been confirmed after inspection of the carrier C1' that there is no abnormality, the wafers W are taken out of the carrier C1' by the wafer delivery/posture changing device 70, followed by closing the lid of the carrier C1' and the window portion 16 and subsequently moving upward the carrier C1' to the retreat position by operating the carrier retreat device 60 (FIG. 10C). Incidentally, the wafer delivery/posture changing device 70 should be put in a state that the wafers W taken out of the carrier C1' can be transplanted into the wafer vertical holding mechanism 21b and that the device 70 is capable of gaining access to the carrier C2' that is to be disposed on the inspection/delivery stage 15 in the next step.

Since the inspecting position, i.e., the inspection/delivery stage 15, is rendered vacant by the movement of the carrier C1' to the retreat position, the carrier transfer device 12 holding the carrier C2' disposes the carrier C2' on the inspection/delivery stage 15. Then, the lid of the carrier C2' and the window portion 16 are opened so as to inspect again the wafer W by using the wafer inspecting device 18. Also, the carrier transfer device 12 receives the vacant carrier C1' in the retreat position and returns the received vacant carrier C1' back to the original storing position. Further, the carrier transfer device 12 holds the carrier C3' and transfers the carrier C3' from its storing position to a position close to the inspecting position (FIG. 10D).

If it has been confirmed after inspection of the carrier C2' that there is no abnormality, the wafers W are taken out of the carrier C2' by operating the wafer delivery/posture changing device 70, followed by closing the lid of the carrier C2' and the window portion 16 and subsequently moving upward the carrier C2' to the retreat position by operating the carrier retreat device 60 (FIG. 10E). In the interface section 3, the wafer delivery/posture changing device 70 transplants the wafers W taken out of the carrier C2' to the wafer vertical holding mechanism 21b and further delivers the wafers W from the wafer vertical holding mechanism 21b to the wafer transfer device 22. The wafer transfer device 22 transfers the wafers W to the first transfer device 37 of the liquid processing section 4 or to the parking areas 9a and 9b and, then, receives the wafers W after the liquid processing and the drying treatment from the transfer device 25 or the parking areas 9a and 9b so as to transplant the received wafers W to the wafer vertical holding mechanism 21b. In this fashion, the apparatus should be rendered ready for transplanting the wafers W from the wafer vertical holding mechanism 21b to the wafer delivery/posture changing device 70.

In the carrier stock section 6, the inspecting position is rendered vacant because the carrier C2' is moved to the retreat position. Therefore, the carrier transfer device 12 holding the carrier C3' disposes the carrier C3' on the inspection/delivery stage 15. Concerning the carrier C3', the lid of the carrier C3' and the window portion 16 are opened so as to transfer the wafers W after the liquid processing from the wafer delivery/posture changing device 70 into the carrier C3', and the housed state of the wafers W are inspected by the wafer inspecting device 18. Also, the carrier transfer device 12 receives the carrier C2' in the retreat position from the carrier retreat device 60 and returns the received carrier C2' to the original storing position. Further, the carrier transfer device 12 holds the carrier C4' and transfers the carrier C4' from the storing position to a position close to the inspecting position (FIG. 10F).

After the inspection in the carrier C3' has been finished, the lid of the carrier C3' and the window portion 16 are closed, and the carrier C3' is moved to the retreat position by the carrier retreat device 60 (FIG. 10G). Then, the carrier transfer device 12 holding the carrier C4' disposes the carrier C4' on the inspection/delivery stage 15, followed by receiving the carrier C3' in the retreat position from the carrier retreat device 60 and returning the received carrier C3' to the original storing position (FIG. 10H). In the inspecting position, the lid of the carrier C4' and the window 16 are opened, and the wafers W after the liquid processing are transferred from the wafer delivery/posture changing device 70 into the carrier C4' for inspection of the housed state of the wafers W by the wafer inspecting device 18.

After the inspection of the carrier C4' has been finished, the lid of the carrier C4' and the window portion 16 are closed, and the carrier transfer device 12 transfers the carrier C4' from the inspecting position to the original storing position (FIG. 10I), thereby finishing the predetermined processing applied to the wafers W housed in the carriers C1' to C4'.

By arranging the carrier retreat device 60 as in the liquid processing apparatus 100, the carrier transfer device 12 can be operated even while a certain carrier C is being inspected by the wafer inspecting device 18 so as to shorten the transfer time of the carrier C in the carrier stock section 6 and, thus, to improve the through-put.

The carrier C or C' is transferred into the carrier stock section 6 and is moved within the carrier stock section 6 as described above in each of the liquid processing apparatuses 1 and 100 according to the embodiments of the present invention. However, the manner of transferring the carrier C or C' into the carrier stock section 6 and moving the carrier C or C' within the carrier stock section 6 is not limited to the manner described above.

When it comes to the case where two carriers C, i.e., first and second carriers C, are processed as a single lot in, for example, the liquid processing apparatus 1, it is possible to employ any of the two methods described below in the case where the number of lots to be processed is not determined, though the combination of the carriers C is determined.

In the first method, the number and state of wafers housed in the first carrier C are inspected first and, where there is no problem, the first carrier C is stored in a predetermined position in the carrier stock section 6. On the other hand, where the number of wafers has been found to be short in the inspection of the first carrier C, the first carrier C is returned to the carrier delivery section 5, and the next lot is inspected without inspecting the second carrier C forming a pair with the first carrier C.

Where there is no problem in the first carrier C, the number and state of wafers housed in the second carrier C are inspected. Where there is no problem in the wafers W housed in the second carrier C, the wafer delivery device 19 transfers the wafers W from the second carrier C into the interface section 3 and, then, into the wafer vertical holding mechanism 21b. After the vacant second carrier C, from which the wafers W were taken out, is disposed on any of the carrier holding members 13 arranged in the carrier stock section 6, the first carrier C that were inspected previously is moved to the inspection/delivery stage 15 and the number and state of the wafers W are inspected again, as required. Then, the wafers W are transferred into the interface section 3 and, then, into the wafer vertical holding mechanism 21b.

The 50 wafers W housed in the first and second carriers C held by the wafer vertical holding mechanism 21b are transplanted into the wafer transfer device 22 so as to start the liquid processing. While the liquid processing is being carried out, the carrier C constituting the lot that is to be processed in the next step can be similarly inspected. On the other hand, the carriers after the inspection can be stored one by one in the carrier stock section 6, or the wafers W can be transferred toward the parking areas 9a and 9b.

In the second method, the first carrier C and the second carrier C are stored first in predetermined positions within the carrier stock section 6. Then, the first carrier C is moved to the inspection/delivery stage 15 so as to inspect the number and state of wafers W housed in the first carrier C. Where there is no problem, the first carrier C is returned to the original storing position within the carrier stock section 6. Then, the second carrier C is moved to the inspection/delivery stage 15 so as to inspect the number and state of wafers W housed in the second carrier C. Where there is no problem, the second carrier C is returned again back to the original storing position within the carrier stock section 6.

Where the number of wafers W has been found to be short in the inspection of the first carrier C, the first carrier C is transferred into the carrier delivery section 5. The second carrier C is also transferred into the carrier delivery section 5. Then, the inspection of the next lot is started.

Where there is no problem in any of the first and second carriers C, the first carrier C is moved first to the inspection/delivery stage 15 for inspection of the number and state of wafers W housed in the first carrier C, as required. Where there is no problem in the inspection, the wafer delivery device 19 takes the wafers W out of the first carrier C and transfers the wafers W taken out of the first carrier C to the wafer vertical holding mechanism 21b. After the vacant first carrier C, from which the wafers W were taken out, is returned to the original storing position within the carrier stock section 6, the second carrier C is moved to the inspection/delivery stage 15 for inspection again of the number and state of wafers W housed in the second carrier C, as required. Where there is no problem in the inspection, the wafer delivery device 19 takes the wafers W out of the second carrier C and transfers the wafers W thus taken out to the wafer vertical holding mechanism 21b.

In this fashion, the 50 wafers W housed in the first and second carriers C held by the wafer vertical holding mechanism 21b are transplanted onto the wafer transfer device 22, and the liquid processing is started. While the liquid processing is being carried out, the carrier C constituting the lot that is to be processed in the next step can be similarly inspected. On the other hand, the carriers after the inspection can be stored in the carrier stock section 6, or the wafers W can be transferred toward the parking areas 9a and 9b.

Where there are a plurality of additional carriers C housing wafers that are to be processed and a pair of carriers C forming a single lot are not formed in advance, it is possible to form a lot within the liquid processing apparatus 1 for recording the information. In this case, where there is no problem in the first carrier C such as shortage of the number of wafers, the wafers W are taken out of the first carrier C on the spot and transferred to the wafer vertical holding mechanism 21b. The vacant first carrier C is stored in a predetermined position within the carrier stock section 6. Where shortage in the number of wafers has been confirmed in the wafers W housed in the second carrier C, the second carrier C is returned to the carrier delivery section 5 or, after temporarily stored in the carrier stock section 6, returned to the carrier delivery section 5 at a predetermined timing without applying a liquid processing to the wafers W housed in the second carrier C.

Where it has been confirmed in respect of the third carrier C that there is no shortage in the number of wafers W and that it is possible to start application of the liquid processing to the wafers W without problem, the wafers W are taken out of the third carrier C and transferred to the wafer vertical holding mechanism 21b. In this fashion, a single lot is formed by the first and third carriers C and recording is made to that effect. It is possible to perform such a one-by-one processing by using the liquid processing apparatuses 1 and 100.

In each of the embodiments described above, the technical idea of the present invention is applied to a semiconductor wafer. However, it is also possible to apply the technical idea of the present invention to other substrates such as a substrate for a liquid crystal display device (LCD).

The embodiments described above are simply intended to clarify the technical concept of the present invention. Of course, the present invention should not be limited to the embodiments described above in interpreting the technical scope of the present invention. The present invention can be worked in variously modified fashions within the spirit of the present invention and within the scope defined by the accompanying claims.

What is claimed is:

1. A liquid processing method for transferring a plurality of sets of substrates, which are respectively housed in a plurality of carriers placed on an a delivery section, onto one holder placed at an interface section, and then applying predetermined liquid processing to the sets of substrates held on the holder in a liquid processing section, the method comprising:

respectively placing the carriers at an inspection position of the delivery section and performing an inspection of the number and/or housed state of the set of substrates housed in each carrier;

transferring a carrier with the set of substrates housed herein from the inspection position to a carrier stock section of the delivery section and storing the carrier in the carrier stock section, where the carrier is judged by the inspection that the liquid processing is applicable to the set of substrates housed therein;

determining cancellation of liquid processing to all the sets of substrates housed in the carriers and preventing the sets of substrates from being transferred to the interface section, where one of the carriers is judged by the inspection that the liquid processing is not applicable to the set of substrates housed therein;

respectively placing the carriers at a pickup position of the delivery section and transferring the sets of substrates from the carriers onto the holder in the interface section, after all the carriers are judged by the inspection that the liquid processing is applicable to the sets of substrates housed therein; and applying the liquid processing to the sets of substrates held on the holder in the liquid processing section.

2. The liquid processing method according to claim 1, wherein the inspection position and the pickup position are defined by a common inspection/delivery stage, and the method comprises returning a carrier stored in the carrier stock section to the inspection/delivery stage to transfer the set of substrates housed therein onto the holder.

3. The liquid processing method according to claim 2, wherein the inspection/delivery stage is configured to place one carrier thereon at a time, and the method comprises sequentially transferring the carriers onto the inspection/delivery stage.

4. The liquid processing method according to claim 2, wherein the method comprises transferring a set of substrates from a carrier to the holder by a substrate transfer unit disposed in the interface section opposite to the inspection/delivery stage.

5. The liquid processing method according to claim 4, wherein the method further comprises transferring a set of substrates processed by the liquid processing by the substrate transfer unit into a carrier placed on the inspection/delivery stage.

6. The liquid processing method according to claim 5, wherein the method further comprises performing an inspection of an arranged state of the sets of substrates on the holder after the liquid processing.

7. The liquid processing method according to claim 1, wherein the method comprises transferring the carriers in the I/O section by a carrier transfer system of the delivery section.

8. The liquid processing method according to claim 7, wherein the carrier transfer system comprises a plurality of carrier transfer units.

9. The liquid processing method according to claim 1, wherein the plurality of carriers are two carriers.

10. The liquid processing method according to claim 1, wherein the method further comprises putting next sets of substrates in a waiting position near the liquid processing section, while applying the liquid processing to the sets of substrates held on the holder in the liquid processing section.

11. A liquid processing method for transferring first and second sets of substrates, which are respectively housed in first and second carriers placed on an a delivery section, onto one holder placed at an interface section, and then applying predetermined liquid processing to the first and second sets of substrates held on the holder in a liquid processing section, the method comprising:

a first step of placing the first carrier at an inspection/delivery stage of the delivery section, and performing an inspection of the number and/or housed state of the first set of substrates housed in the first carrier;

a second step of transferring the first carrier with the first set of substrates housed therein from the inspection/delivery stage to a carrier stock section of the delivery section and storing the first carrier in the carrier stock section, where the first carrier is judged by the inspection of the first step that the liquid processing is applicable to the first set of substrates housed therein, and determining cancellation of liquid processing to all the first and second sets of substrates housed in the first and second carriers and preventing the first and second sets of substrates from being transferred to the interface section, where the first carrier is judged by the inspection of the first step that the liquid processing is not applicable to the first set of substrates housed therein;

a third step of placing the second carrier at the inspection/delivery stage, and performing an inspection of the number and/or housed state of the second set of substrates housed in the second carrier, where the first carrier is stored in the carrier stock section; and a fourth step of respectively placing the first and second sets at the inspection/delivery stage, and transferring the first and second sets of substrates from the first and second carriers onto the holder in the interface section to apply the liquid processing thereto, where the second carrier is judged by the inspection of the third step that the liquid processing is applicable to the second set of substrates housed therein, and determining cancellation of liquid processing to all the first and second sets of substrates housed in the first and second carriers and preventing the first and second sets of substrates from being transferred to the interface section, where the second carrier is judged by the inspection of the third step that the liquid processing is not applicable to the second set of substrates housed therein.

12. The liquid processing method according to claim 11, wherein the method comprises transferring the first and second sets of substrates from the first and second carriers to the holder by a substrate transfer unit disposed in the interface section opposite to the inspection/delivery stage.

13. The liquid processing method according to claim 12, wherein the method further comprises transferring each of the first and second sets of substrates processed by the liquid processing by the substrate transfer unit into a carrier placed on the inspection/delivery stage.

14. The liquid processing method according to claim 13, wherein the method further comprises performing an inspection of an arranged state of the first and second sets of substrates on the holder after the liquid processing.

* * * * *